United States Patent
Fujita et al.

(10) Patent No.: US 12,355,346 B2
(45) Date of Patent: Jul. 8, 2025

(54) NOISE FILTER

(71) Applicants: Mitsubishi Electric Corporation, Tokyo (JP); Mitsubishi Electric Engineering Company, Limited, Tokyo (JP)

(72) Inventors: Yuki Fujita, Tokyo (JP); Yasuaki Furusho, Tokyo (JP); Hiroyuki Ichinose, Tokyo (JP)

(73) Assignees: MITSUBISHI ELECTRIC CORPORATION, Tokyo (JP); MITSUBISHI ELECTRIC ENGINEERING COMPANY, LIMITED, Tokyo (JP)

(*) Notice: Subject to any disclaimer, the term of this patent is extended or adjusted under 35 U.S.C. 154(b) by 265 days.

(21) Appl. No.: 18/028,255

(22) PCT Filed: Nov. 11, 2020

(86) PCT No.: PCT/JP2020/042014
§ 371 (c)(1),
(2) Date: Mar. 24, 2023

(87) PCT Pub. No.: WO2022/102005
PCT Pub. Date: May 19, 2022

(65) Prior Publication Data
US 2023/0378868 A1 Nov. 23, 2023

(51) Int. Cl.
*H02M 1/44* (2007.01)
*H03H 7/01* (2006.01)

(52) U.S. Cl.
CPC ............ *H02M 1/44* (2013.01); *H03H 7/0138* (2013.01)

(58) Field of Classification Search
CPC ........ H02M 1/123; H02M 1/44; H02M 1/126; H02M 7/4815; H02M 5/458;
(Continued)

(56) References Cited

U.S. PATENT DOCUMENTS

| 6,208,098 B1* | 3/2001 | Kume | H02M 1/126 |
| | | | 318/803 |
| 2013/0147419 A1* | 6/2013 | Sakai | H02M 1/44 |
| | | | 318/722 |
| 2018/0278176 A1 | 9/2018 | Ogasawara et al. | |

FOREIGN PATENT DOCUMENTS

| JP | 2000-201044 A | 7/2000 |
| JP | 2001-231268 A | 8/2001 |

(Continued)

OTHER PUBLICATIONS

Search Report mailed Nov. 14, 2023, in European Application No. 20961533.5, 7 pages.
(Continued)

*Primary Examiner* — Lincoln D Donovan
*Assistant Examiner* — Tyler J Pereny
(74) *Attorney, Agent, or Firm* — XSENSUS LLP

(57) ABSTRACT

A noise filter includes: a voltage detector that detects a common-mode voltage; a voltage divider circuit that outputs a divided voltage divided from the common-mode voltage; multiple common-mode transformers that are connected separately to respective power lines of multiline systems connected in parallel relation to each other to an input or output of the power converter, and that superimpose a superimposing voltage having an opposite polarity to the common-mode voltage on each of the power lines of multiline systems; and an injection waveform generator that generates at least one output voltage to be outputted to primary sides of the multiple common-mode transformers, on the basis of the divided voltage. The injection waveform generator generates as the output voltage, a voltage with which a difference between the superimposing voltage to be super-imposed on each of the power lines and the common-mode voltage is within an allowable value.

20 Claims, 21 Drawing Sheets

(58) Field of Classification Search
CPC ...... H02M 7/5387; H02M 1/007; H02M 3/01;
H02M 3/33573; H02M 7/48; H01F
2017/0093; H01F 27/006; H01F 27/2895;
H01F 27/34; H01F 37/00; H03H 7/427;
H03H 7/09
See application file for complete search history.

(56) References Cited

FOREIGN PATENT DOCUMENTS

| | | |
|---|---|---|
| JP | 2003-088099 A | 3/2003 |
| JP | 2010-57268 A | 3/2010 |
| JP | 2017-051085 A | 3/2017 |
| JP | 6491349 B2 | 3/2019 |
| WO | 00/07274 A2 | 2/2000 |
| WO | 2020/048850 A1 | 3/2020 |

OTHER PUBLICATIONS

Heldwein M L et al., "Implementation of a Transformer-Less Common Mode Active Filter for Off-Line Converter Systems", Applied Power Electronics Conference and Exposition, 2006. APEC'06. Twenty-First Annual IEEE Mar. 19, 2006, Piscataway, NJ, USA,IEEE, Piscataway, NJ, USA, Mar. 19, 2006, pp. 1230-1236, XP010910102, DOI: 10.11 09/APEC. 2006.1620696 ISBN: 978-0-7803-9547-3. p. 1235, Paragraph 1.
International Search Report and Written Opinion mailed on Dec. 28, 2020, received for PCT Application PCT/JP2020/042014, filed on Nov. 11, 2020, 8 pages including English Translation.
Chinese Office Action issued on May 14, 2025, in Patent Application No. 202080106990.0, 14pp.

\* cited by examiner

NOISE FILTER

CROSS-REFERENCE TO RELATED APPLICATION

The present application is based on PCT filing PCT/JP2020/042014, filed Nov. 11, 2020, the entire contents of which are incorporated herein by reference.

TECHNICAL FIELD

The present application relates to a noise filter.

BACKGROUND ART

Recently, with respect to power conversion devices such as voltage-type PWM (Pulse Width Modulation) inverters, according to the development of power semiconductor elements, works are in progress to increase the carrier frequencies. However, in association with the increased carrier frequency, electromagnetic interference due to common-mode voltage produced at the time of switching operations of the power semiconductor elements, emerges as a problem. In order to deal with this problem, there is proposed a method in which, using a common-mode transformer, a voltage (cancellation voltage) for cancelling a common-mode voltage produced by the power conversion device is superimposed on that voltage, to thereby reduce a leakage current flowing due to the common-mode voltage toward the ground, that is, a common-mode current (for example, Patent Document 1).

A common-mode reduction circuit of Patent Document 1 includes: a common-mode transformer whose secondary coils, namely, secondary windings, are interposed in three-phase cables that connect the inverter with a motor; a capacitor that is connected in series to a primary coil, namely, a primary winding, of the common-mode transformer; a group of capacitors that detect the common-mode voltage; and an emitter follower circuit that outputs a cancellation voltage resulting from power amplification of the common-mode voltage, to the primary winding of the common-mode transformer. According to the common-mode reduction circuit of Patent Document 1, the turn ratio between the primary winding and the secondary winding of the common-mode transformer is 1:1 and only components of the common-mode voltage with frequencies more than the switching frequency are cancelled out, so that the common-mode transformer for superimposing the cancellation voltage is downsized as compared with the case where the common-mode voltage is nullified.

CITATION LIST

Patent Document

Patent Document 1: Japanese Patent No. 6491349

SUMMARY OF THE INVENTION

Problems to be Solved by the Invention

However, according to the common-mode reduction circuit of Patent Document 1, such a problem may arise that, when the phase currents outputted from the inverter are large, since the diameter of each of the three-phase cables that connect the inverter with the motor has to be increased, an inner diameter required for the core is increased, so that the core becomes larger.

An object of techniques disclosed in the present description is to provide a noise filter which can reduce the common-mode voltage by using a small-size common-mode transformer even when an output current of such a power converter is large.

Means for Solving the Problems

A noise filter disclosed as an example in this description is such a noise filter which reduces a common-mode voltage produced by a power converter that performs power conversion using switching operations of semiconductor elements. The noise filter comprises: a voltage detector that detects the common-mode voltage produced by the power converter; a voltage divider circuit that outputs a divided voltage divided from the common-mode voltage detected by the voltage detector; multiple common-mode transformers that are connected separately to respective power lines of multiline systems connected in parallel relation to each other to an input or output of the power converter, and that superimpose a superimposing voltage having an opposite polarity to the common-mode voltage on each of the power lines of multiline systems; and an injection waveform generator that generates at least one output voltage to be outputted to primary sides of the multiple common-mode transformers, on a basis of the divided voltage. The injection waveform generator generates as the output voltage, a voltage with which a difference between the superimposing voltage to be superimposed on each of the power lines and the common-mode voltage is within an allowable value.

Effect of the Invention

According to the noise filter disclosed as an example in this description, the multiple common-mode transformers that are connected separately to the respective power lines of multiline systems are included, and the injection waveform generator generates the output voltage with which a difference between the superimposing voltage to be superimposed on each of the power lines and the common-mode voltage is within an allowable value. This makes it possible, even when an output current of the power converter is large, to reduce the common-mode voltage by using a small-size common-mode transformer.

MODES FOR CARRYING OUT THE INVENTION

Figure 1:
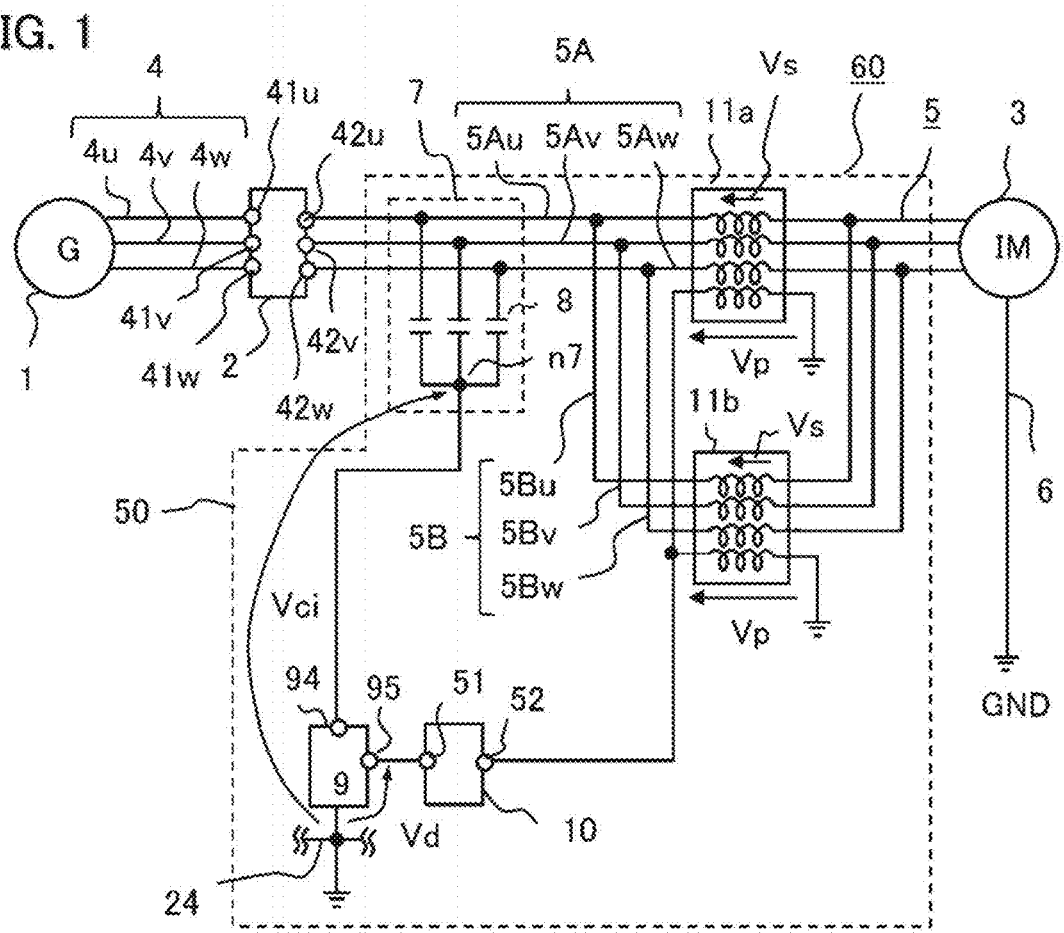
FIG. 1 is a diagram showing a configuration of a first noise filter and an electric motor drive system according to Embodiment 1.

Noise filters and electric motor drive systems will be described with reference to the drawings. The description will be made while giving the same reference numerals to the same or equivalent parts in the figures.

Embodiment 1

Figure 2:
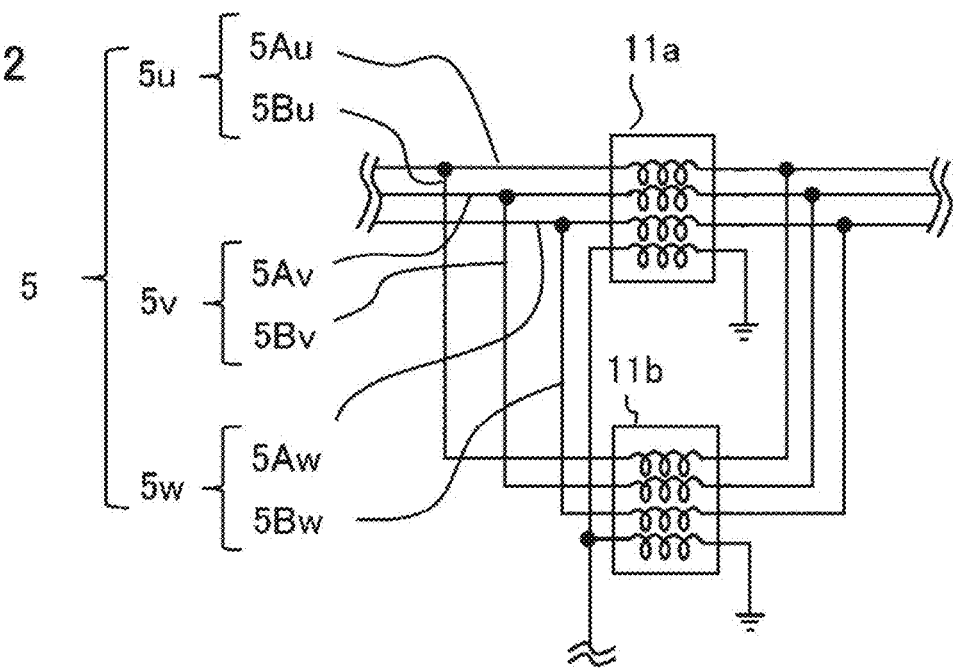
FIG. 2 is a diagram showing three-phase power lines on an output side of a power converter in FIG. 1.
Figure 3:
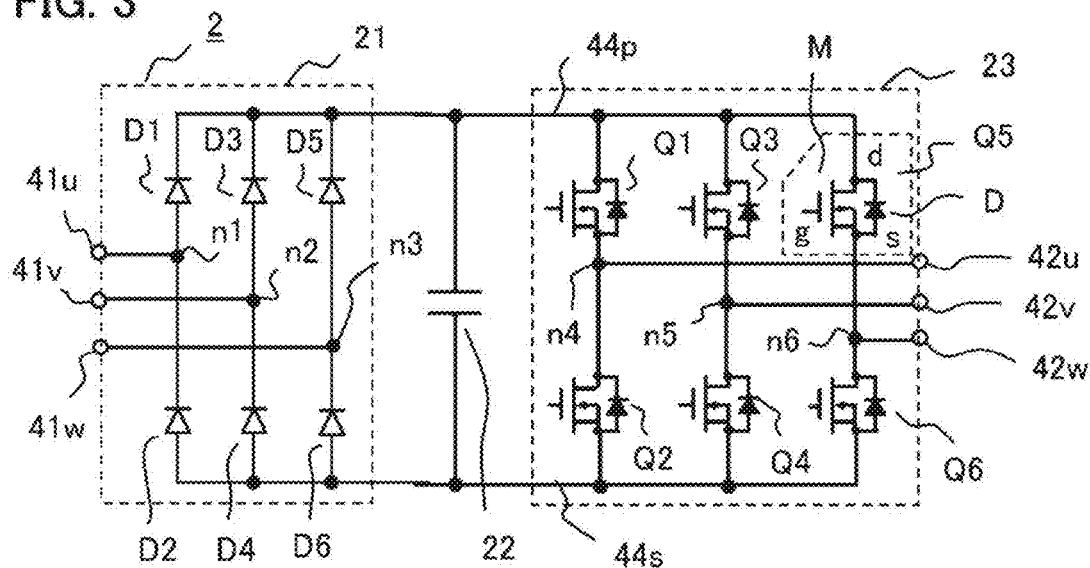
FIG. 3 is a diagram showing a configuration of the power converter in FIG. 1.
Figure 4:
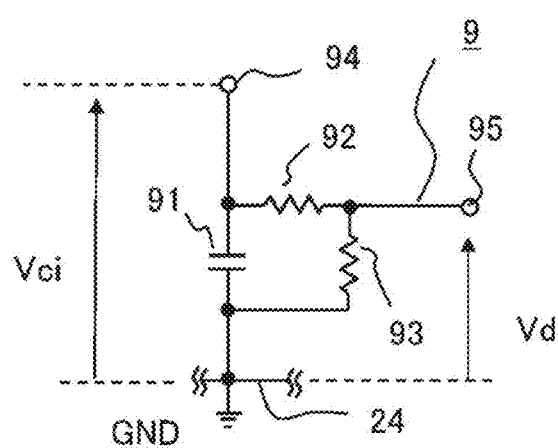
FIG. 4 is a diagram showing a configuration of a voltage divider circuit in FIG. 1.
Figure 5:
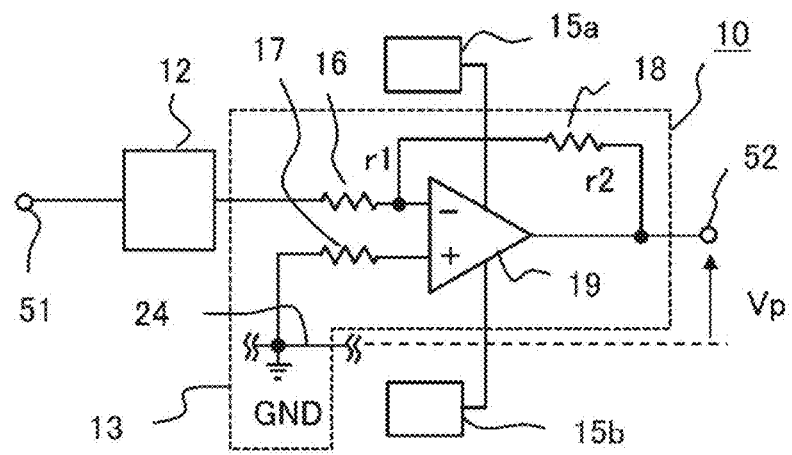
FIG. 5 is a diagram showing a first example of an injection waveform generator in FIG. 1.
Figure 6:
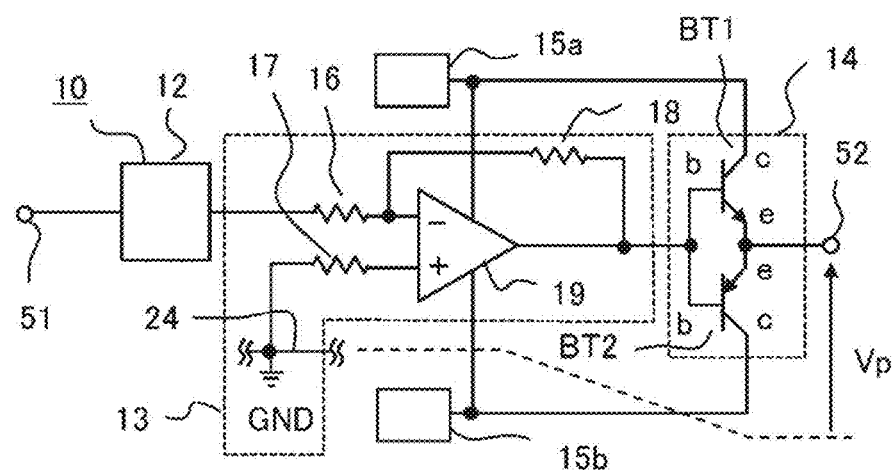
FIG. 6 is a diagram showing a second example of the injection waveform generator in FIG. 1.
Figure 7:
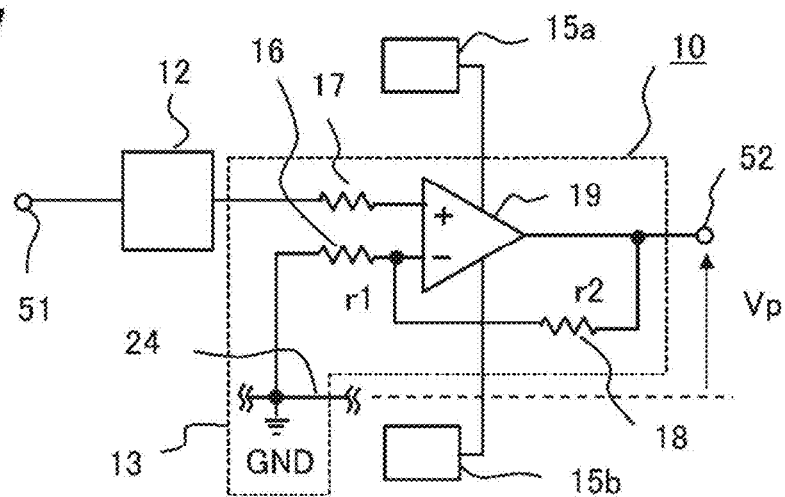
FIG. 7 is a diagram showing a third example of the injection waveform generator in FIG. 1.
Figure 8:
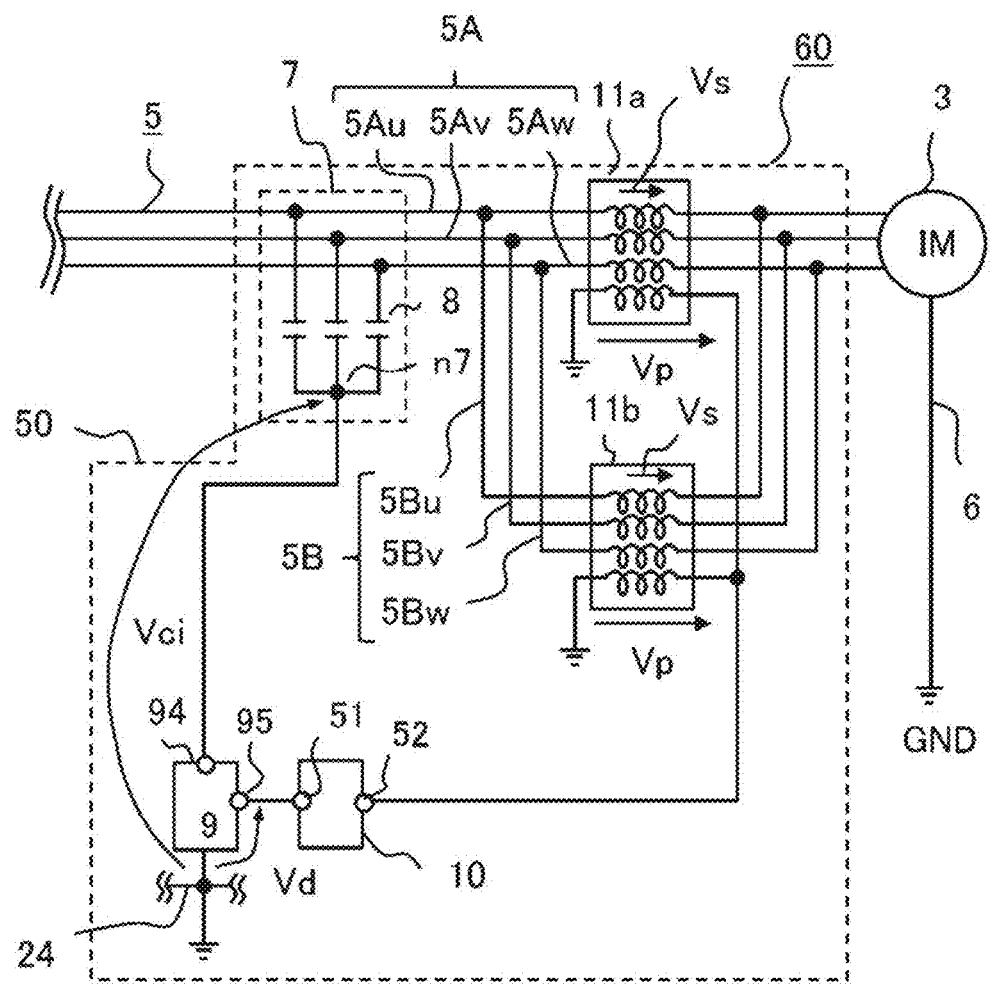
FIG. 8 is a diagram showing a configuration of a second noise filter and an electric motor drive system according to Embodiment 1.
Figure 9:
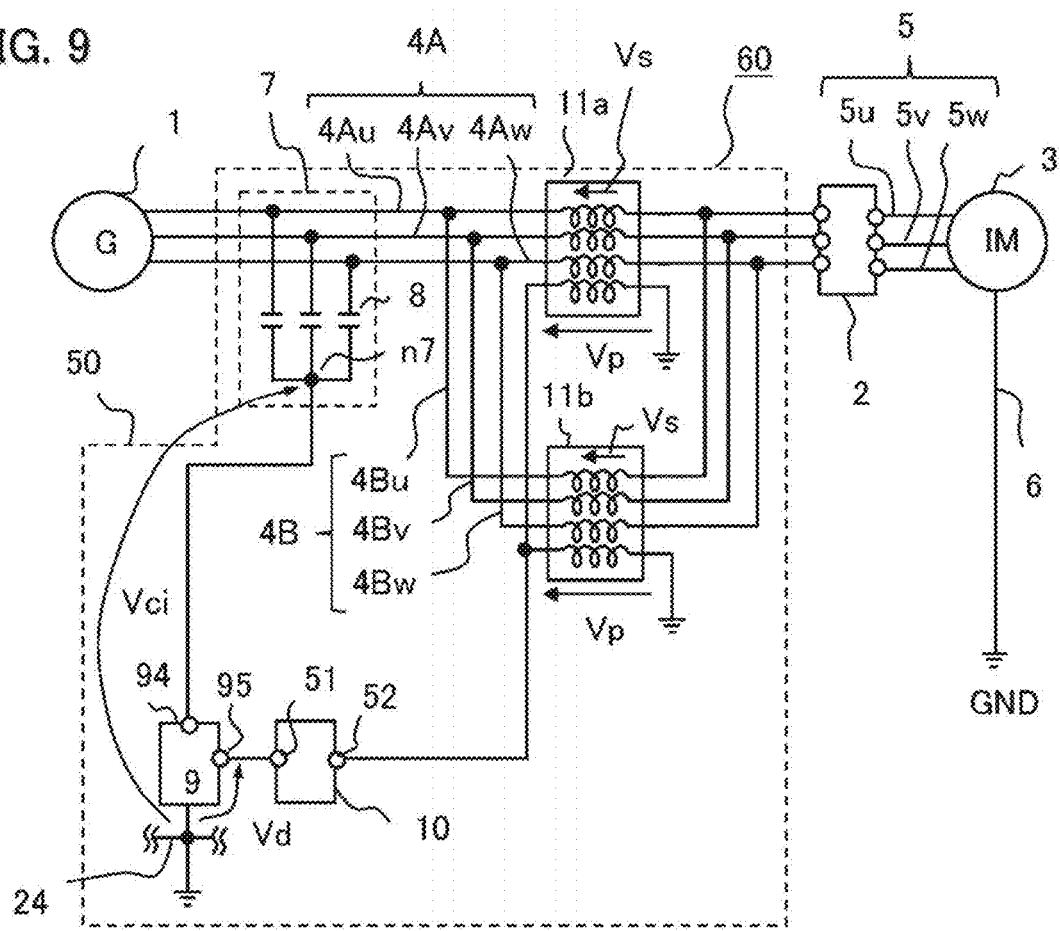
FIG. 9 is a diagram showing a configuration of a third noise filter and an electric motor drive system according to Embodiment 1.
Figure 10:
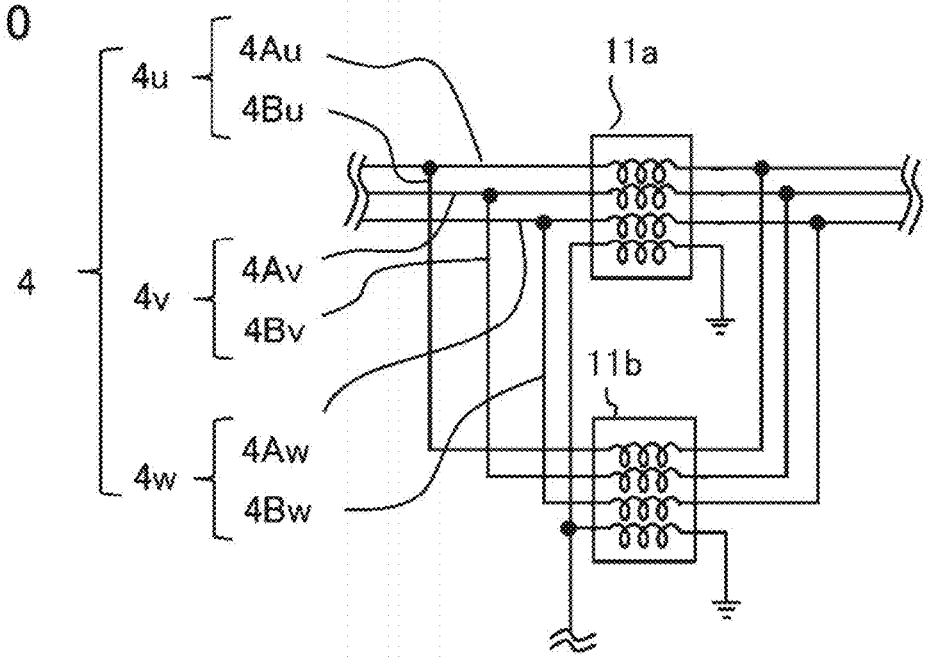
FIG. 10 is a diagram showing three-phase power lines on an input side of a power converter in FIG. 9.
Figure 11:
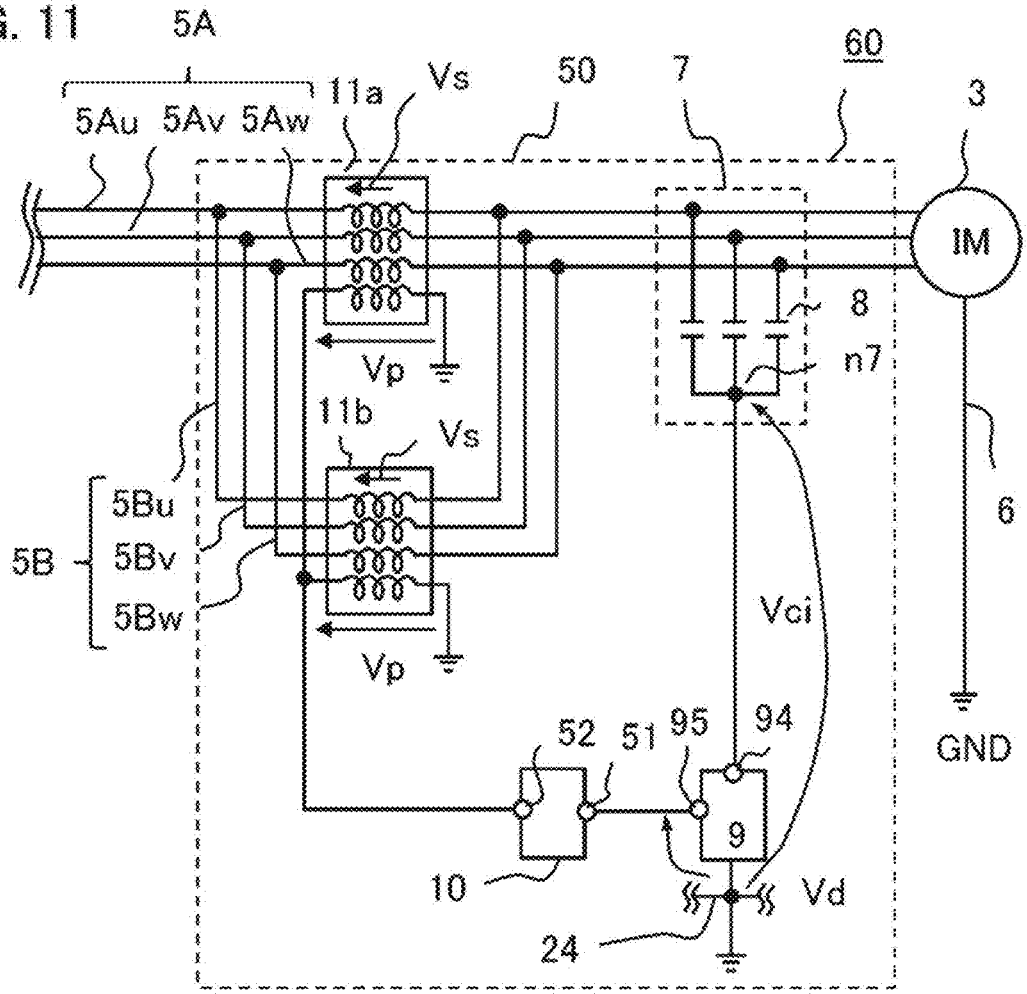
FIG. 11 is a diagram showing a configuration of a fourth noise filter and an electric motor drive system according to Embodiment 1.
Figure 12:
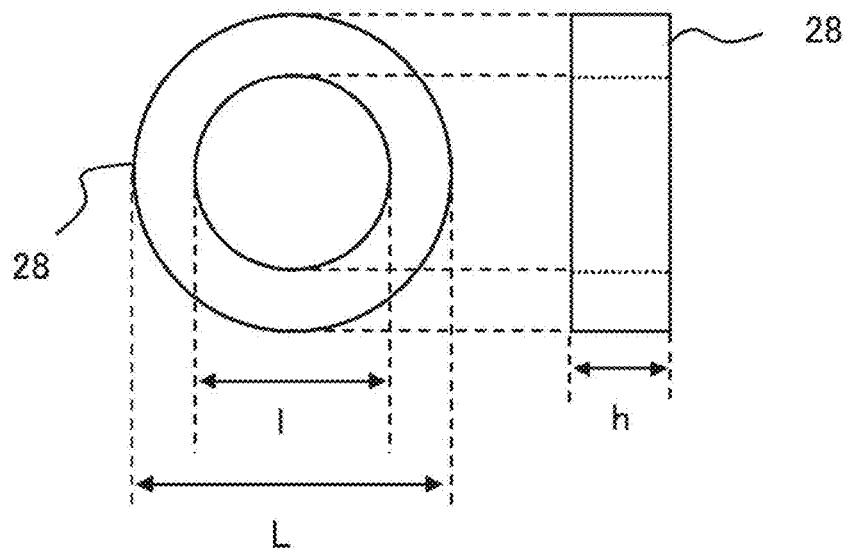
FIG. 12 is a diagram showing a core for the noise filter according to Embodiment 1.
Figure 13:
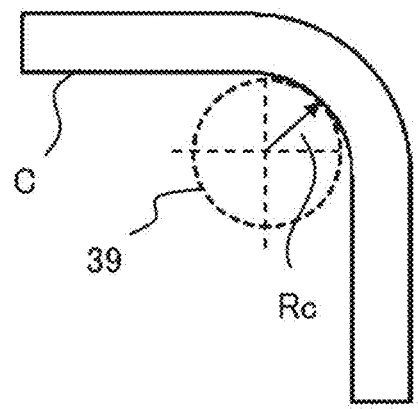
FIG. 13 is a diagram illustrating a curvature radius of an electric cable.
Figure 14:
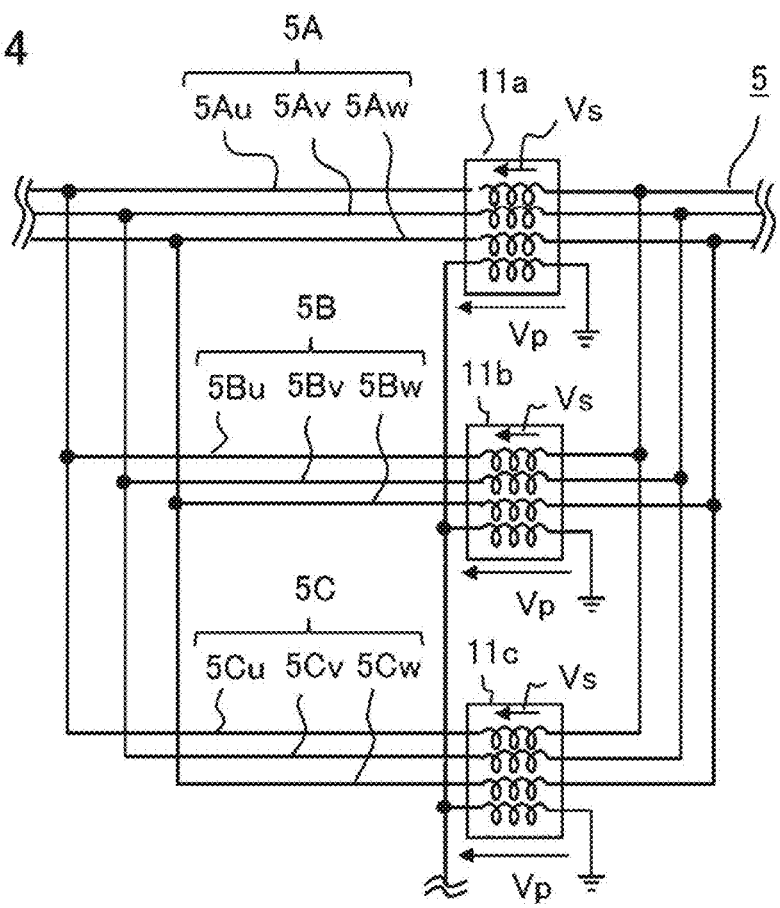
FIG. 14 is a diagram showing a main part of a fifth noise filter according to Embodiment 1.

FIG. 1 is a diagram showing a configuration of a first noise filter and an electric motor drive system according to Embodiment 1, and FIG. 2 is a diagram showing three-phase power lines on the output side of a power converter in FIG. 1. FIG. 3 is a diagram showing a configuration of the power converter in FIG. 1 and FIG. 4 is a diagram showing a configuration of a voltage divider circuit in FIG. 1. FIG. 5 is a diagram showing a first example of an injection waveform generator in FIG. 1; FIG. 6 is a diagram showing a second example of the injection waveform generator in FIG. 1; and FIG. 7 is a diagram showing a third example of the injection waveform generator in FIG. 1. FIG. 8 is a diagram showing a configuration of a second noise filter and an electric motor drive system according to Embodiment 1. FIG. 9 is a diagram showing a configuration of a third noise filter and an electric motor drive system according to Embodiment 1, and FIG. 10 is a diagram showing three-phase power lines on the input side of a power converter in FIG. 9. FIG. 11 is a diagram showing a configuration of a fourth noise filter and an electric motor drive system according to Embodiment 1. FIG. 12 is a diagram showing a core for the noise filter according to Embodiment 1, and FIG. 13 is a diagram illustrating a curvature radius of an electric cable. FIG. 14 is a diagram showing a main part of a fifth noise filer according to Embodiment 1. A noise filter 50 of Embodiment 1 is employed in an electric motor drive system 60 that is a system to control an induction motor 3 by using a power converter 2 such as a voltage-type PWM inverter or the like in which multiple semiconductor elements perform switching operations.

The electric motor drive system 60 includes: an AC power supply 1 such as an electric power system, an autonomous voltage source or the like; the power converter 2 that converts AC power of the AC power supply 1 to DC power and then converts the DC power to AC power; a three-phase power line 4 that connects the AC power supply 1 with the power converter 2; a three-phase power line 5 that connects the power converter 2 with the induction motor 3; and the noise filter 50. The induction motor 3 is grounded by a grounding wire 6. The potential of the ground "GND", that is, the ground potential, is given as a reference potential of the noise filter 50. The three-phase power line 4 includes a u-phase power line for three phases $4u$, a v-phase power line for three phases $4v$ and a w-phase power line for three phases $4w$. The three-phase power line 5 includes u-phase power lines for three phases $5u$, v-phase power lines for three phases $5v$ and w-phase power lines for three phase $5w$, and is composed of two three-phase power lines 5A, 5B, namely, three-phase power lines of two-line systems. The three-phase power line 5A includes a u-phase power line for three phases 5Au, a v-phase power line for three phases 5Av and a w-phase power line for three phases 5Aw. The three-phase power line 5B includes a u-phase power line for three phases 5Bu, a v-phase power line for three phases 5Bv and a w-phase power line for three phases 5Bw. The u-phase power lines for three phases 5u are composed of the power line for three phases 5Au and the power line for three phases 5Bu. The v-phase power lines for three phases 5v are composed of the power line for three phases 5Av and the power line for three phases 5Bv, and the w-phase power lines for three phases 5w are composed of the power line for three phases 5Aw and the power line for three phases 5Bw.

The noise filter 50 includes a voltage detector 7, a voltage divider circuit 9, an injection waveform generator 10 and common-mode transformers 11a, 11b. The power converter 2 includes a forward conversion circuit 21 composed of semiconductor elements, a capacitor 22 as a power storage element for storing DC power, and a reverse conversion circuit 23 composed of semiconductor elements and converting DC power to AC power. The forward conversion circuit 21 is, for example, a rectifier circuit, and includes six diodes D1, D2, D3, D4, D5, D6. The reverse conversion circuit 23 includes six semiconductor elements Q1, Q2, Q3, Q4, Q5, Q6. With respect to the power lines for three phases 4u, 4v, 4w the respective one ends of which are connected to the AC power supply 1, their other ends are connected to AC input terminals 41u, 41v, 41w of the power converter 2, respectively. With respect to the power lines for three phases 5Au, 5Av, 5Aw and the power lines for three phases 5Bu, 5Bv, 5Bw the respective one ends of which are connected to the induction motor 3, their other ends are connected to AC input terminals 42u, 42v, 42w of the power converter 2, respectively. In FIG. 1, such an example is shown in which the three-phase power line 5B is branched from the three-phase power line 5A at its side near the AC power supply 1, and is then joined to the three-phase power line 5A at its side near the induction motor 3. In other figures in which three-phase power lines 5A, 5B are illustrated, the three-phase power lines 5A, 5B also have the same configuration as in FIG. 1. For the sake of simplicity, the three-phase power line 5A is regarded as a mainline system and the three-phase power line 5B is regarded as a branch-line system. In the three-phase power line 5, where appropriate, a part from the end near the AC power supply 1 until just before the branch point and a part from just after the joined point until the end near the induction motor 3, are assumed to belong to the three-phase power line 5A as the mainline system.

In the forward conversion circuit 21, a first series structure in which the diodes D1, D2 are serially connected to each other, a second series structure in which the diodes D3, D4 are serially connected to each other and a third series structure in which the diodes D5, D6 are serially connected to each other, are disposed between a high-potential side wiring 44p and a low-potential side wiring 44s. A connection point n1 between the diode D1 and the diode D2 is connected to the AC input terminal 41u. A connection point n2 between the diode D3 and the diode D4 is connected to the AC input terminal 41v, and a connection point n3 between the diode D5 and the diode D6 is connected to the AC input terminal 41w. The capacitor 22 is connected between the high-potential side wiring 44p and the low-potential side wiring 44s. In the reverse conversion circuit 23, a fourth series structure in which the semiconductor elements Q1, Q2 are serially connected to each other, a fifth series structure in which the semiconductor elements Q3, Q4 are serially connected to each other and a sixth series structure in which the semiconductor elements Q5, Q6 are serially connected to each other, are disposed between the high-potential side wiring 44p and the low-potential side wiring 44s. A connection point n4 between the semiconductor element Q1 and the semiconductor element Q2 is connected to the AC output terminal 42u. A connection point n5 between the semiconductor element Q3 and the semiconductor element Q4 is connected to the AC output terminal 42v, and a connection point n6 between the semiconductor element Q5 and the semiconductor element Q6 is connected to the AC output terminal 42w.

As each of the semiconductor elements Q1, Q2, Q3, Q4, Q5, Q6, a power semiconductor element, for example, a MOSFET (Metal-Oxide-Semiconductor Field-Effect Transistor), an IGBT (Insulated Gate Bipolar Transistor) or the like, is used. In FIG. 3, they are exemplified as MOSFETs. The semiconductor elements Q1, Q2, Q3, Q4, Q5, Q6 each include a MOS transistor M and a diode D. The diode D may be an element independent of the MOS transistor M or may be a parasitic diode thereof. Respective drains "d" of the semiconductor elements Q1, Q3, Q5 are connected to the high-potential side wiring 44p, and respective sources "s" of the semiconductor elements Q2, Q4, Q6 are connected to the low-potential side wiring 44s. The source "s" of the semiconductor element Q1 and the drain "d" of the semiconductor element Q2 are connected to each other; the source "s" of the semiconductor element Q3 and the drain "d" of the semiconductor element Q4 are connected to each other; and the source "s" of the semiconductor element Q5 and the drain "d" of the semiconductor element Q6 are connected to each other. Control signals are inputted from an unshown control circuit, to respective gates "g" of the semiconductor elements Q1, Q2, Q3, Q4, Q5, Q6. The reverse conversion circuit 23 converts DC power to AC power by switching the semiconductor elements Q1, Q2, Q3, Q4, Q5, Q6 on the basis of the control signals from the control circuit.

The voltage detector 7 that detects the common-mode voltage Vci includes three capacitors 8 having mutually the same capacitances, and respective one ends of the capacitors 8 are connected to the respective phases of either one of the three-phase power lines 5A, 5B. The respective other ends of the capacitors 8 are connected to each other at a connection point n7. With respect to the voltage divider circuit 9, its input terminal 94 is connected to the connection point n7 at which the other ends of the capacitors 8 are connected, and its output terminal 95 is connected to an input terminal 51 of the injection waveform generator 10. The voltage divider circuit 9 divides the common-mode voltage Vci that is an input voltage between a wiring 24 placed at the ground potential and the input terminal 94, and outputs a divided voltage Vd thus divided, as an output voltage.

The voltage divider circuit 9 includes, for example, a capacitor 91 and a series structure of a resistor 92 and a resistor 93 that is parallelly connected to the capacitor 91. One end of the capacitor 91 and one end of the resistor 92 are connected to the input terminal 94, and the other end of the capacitor 91 and an end other than one end of the resistor 93 are connected to the wiring 24 placed at the ground potential. A connection point at which the other end of the resistor 92 and the one end of the resistor 93 are connected to each other, is connected to the output terminal 95. The voltage divider circuit 9 outputs from the output terminal 95, the divided voltage Vd that is divided from the common-mode voltage Vci inputted to the input terminal 94. The detected common-mode voltage Vci is divided according to a resistance ratio of the resistor 92 and the resistor 93. The voltages of the power lines for three phases 5u, 5v, 5w corresponding to the respective phases of the three-phase power line 5 are each divided according to an impedance ratio of the capacitor 8 and the capacitor 91 and thereafter, the resultant voltage is divided according to the resistance ratio of the resistor 92 and the resistor 93, and the thus-divided voltage is outputted as the divided voltage Vd from the voltage divider circuit 9.

The divided voltage Vd is inputted to the input terminal 51 of the injection waveform generator 10. Based on the divided voltage Vd thus inputted, the injection waveform generator 10 outputs from its output terminal 52, a voltage whose band has been limited and whose voltage value has been adjusted. The voltage outputted from the output terminal 52 of the injection waveform generator 10 is inputted to the primary sides, that is, the primary windings of the common-mode transformers 11a, 11b. The common-mode transformers 11a, 11b each include the primary winding on the primary side and secondary windings on the secondary side. The secondary windings of the common-mode transformer 11a are inserted in the power lines for three phases 5Au, 5Av, 5Aw corresponding to the respective phases of the three-phase power line 5A. The secondary windings of the common-mode transformer 11b are inserted in the power lines for three phases 5Bu, 5Bv, 5Bw corresponding to the respective phases of the three-phase power line 5B. The voltage outputted from the injection waveform generator 10, namely, an output voltage Vp, is applied to the primary winding of each of the common-mode transformers 11a, 11b, so that an injection voltage Vs that is a voltage having an opposite polarity to the common-mode voltage Vci and corresponding to the turn ratio between windings of the primary side and the secondary side, is induced in the secondary winding. The injection voltage Vs is a superimposing voltage to be superimposed on each of the three-phase power lines 5A, 5B as power lines of multiline systems.

The power converter 2 produces the common-mode voltage Vci that varies stepwise every time the semiconductor elements Q1 to Q6 perform switching operations. The common-mode voltage Vci is detected by the voltage detector 7 and is divided by the voltage divider circuit 9 to provide the divided voltage Vd. The output voltage Vp resulting from limiting the band of the divided voltage Vd and adjusting the voltage value thereof by the injection waveform generator 10, and outputted from that generator, is then inputted to the primary windings of the common-mode transformers 11a, 11b. The voltage induced in each of the secondary windings of the common-mode transformers 11a, 11b, namely, the injection voltage Vs, has been adjusted so as to reduce the common-mode voltage Vci produced by the power converter 2. Accordingly, based on the common-mode voltage Vci detected by the voltage detector 7, the noise filter 50 of Embodiment 1 inputs the output voltage Vp that is the adjusted voltage having an opposite polarity to the common-mode voltage Vci, to the common-mode transformers 11a, 11b, to thereby superimpose the injection voltage Vs on each of the phases of the three-phase power lines 5A, 5B. This makes it possible to reduce the common-mode voltage Vci. The reason why, even when the output current of the power converter 2 is large, the noise filter 50 of Embodiment 1 can reduce the common-mode voltage Vci by using small-size common-mode transformers 11a, 11b, will be described.

In FIG. 5 to FIG. 7, first to third examples of the injection waveform generator 10 are shown. The first example of the injection waveform generator 10 shown in FIG. 5 includes a band limiter 12, an amplifier 13 and control power supplies 15a, 15b. The control power supply 15a supplies a positive-side voltage, and the control power supply 15b supplies a negative-side voltage. Because of the band limiter 12, out of the common-mode voltage Vci, only its components corresponding to the frequency band subject to reduction can be applied to the common-mode transformers 11a, 11b. This makes it possible to downsize the common-mode transformers 11a, 11b. The band limiter 12 only has to be able to pass the components corresponding to the frequency band subject to reduction, and one of a bandpass filter, a low-pass filter and a high-pass filter may be employed therefor. The amplifier 13 shown in FIG. 5 is an inverting amplifier circuit as an example. The amplifier 13 includes an op-amp 19 and resistors 16, 17, 18. To the positive-side input terminal of the op-amp 19, the ground potential is inputted through the resistor 17. To the negative-side input terminal of the op-amp 19, the output of the band limiter 12 is inputted through the resistor 16, and the output of the op-amp 19 is inputted through the resistor 18.

When the resistance values of the resistor 16 and the resistor 18 are defined as r1 and r2, respectively, a gain Gi of the op-amp 19 can be represented by a formula (1). Further, the output voltage Vp can be represented by a formula (2).

$$Gi = r2/r1 \tag{1}$$

$$Vp = -Gi \times Vd \tag{2}$$

The gain Gi of the op-amp 19 is determined depending on a dividing ratio Rv of the voltage divider circuit 9 and a turn ratio Rr of the common-mode transformers 11a, 11b. The gain Gi, the dividing ratio Rv and the turn ratio Rr are set so that the injection voltage Vs as the voltage superimposed through the secondary windings of the common-mode transformers 11a, 11b, on the u phases, v phases and w phases of the three-phase power lines 5A, 5B, reduces the common-mode voltage Vci, namely, a following formula (3) is satisfied.

$$|Vci - Vs| \le Vto \tag{3}$$

Here, "Vto" denotes an allowable value of the voltage difference. The formula (3) indicates that an absolute value of the difference between the common-mode voltage Vci and the injection voltage Vs is within the allowable value Vto.

The dividing ratio Rv of the voltage divider circuit 9 can be represented by a formula (4). When the numbers of turns of the primary winding and the secondary winding are defined as N1, N2, respectively, the turn ratio Rr of the common-mode transformers 11a, 11b can be represented by a formula (5).

$$Rv = Vci/Vd \tag{4}$$

$$Rr = N2/N1 \tag{5}$$

An output current from the power converter 2 flows in a branched manner into the three-phase power lines 5A, 5B, so that a required allowable current It for each of the three-phase power lines 5A, 5B becomes smaller than the maximum output current of the power converter 2.

Here, the allowable current It for an electric cable can be represented by a formula (6), where "T1" denotes an allowable maximum temperature of the electric cable, "T" denotes an ambient temperature, "rm" denotes a conductor effective resistance at the allowable maximum temperature T1 of the electric cable, "R" denotes a whole thermal resistance of the conductor, and "η0" denotes a reduction rate of an allowable current at the time of multi-laying of conductor. For example, the three-phase power lines 5A, 5B are each provided as electric cables which include, three conductors, insulators covering the respective conductors to insulate them from each other, and coatings covering the respective surfaces of the insulators. The three-phase power lines 5A, 5B each include three conductors and thus correspond to the case of triple-laying of conductor. Note that the three conductors may each be multicore twisted wires.

$$It = \eta 0 \cdot \sqrt{\{(T1-T)/(rm \times R)\}} \quad (6)$$

Further, the conductor effective resistance rm at the allowable maximum temperature T1 of the electric cable can be represented by a formula (7), where "r0" denotes a conductor resistance when the electric cable is at a temperature of 20° C., and is given as a standard value, and "a" denotes a conductor temperature-resistance coefficient. Further, the whole thermal resistance R of the electric cable can be represented by a formula (8), where "R1" denotes a thermal resistance of the insulator and coating, and "R2" denotes a thermal resistance at the surface of the electric cable. These thermal resistances R1, R2 can be represented by a formula (9) and a formula (10), respectively, where "d1" denotes an outer diameter of the conductor, "d2" denotes an outer diameter of the electric cable, "P1" denotes an intrinsic thermal resistance of the insulator and coating, and "P2" denotes an intrinsic thermal resistance against dissipation at the surface.

$$rm = r0 \times \{1 + \alpha \times (T1-20)\} \quad (7)$$

$$R = R1 + R2 \quad (8)$$

$$R1 = (P^{1/2}\pi) \times \log_e(d2/d1) \quad (9)$$

$$R2 = 10 \times P2/(\pi \times d2) \quad (10)$$

From the formula (6) to the formula (10), it is found that when the required allowable current It for each of the three-phase power lines 5A, 5B becomes smaller, it is possible to decrease the outer diameter d2 of the electric cable. Since the outer diameter d2 of the electric cable of each of the three-phase power lines 5A, 5B can be decreased, it is possible to decrease the outer diameter of an electric cable to be used for the secondary wirings of each of the common-mode transformers 11a, 11b connected to the respective power lines, namely, each of the electric cables of the secondary windings corresponding to the respective phases.

The common-mode transformers 11a, 11b each include one primary winding and three secondary windings. The core of each of the common-mode transformers 11a, 11b is, for example, a toroidal-type core 28 shown in FIG. 12. The inner diameter of the core 28 is "I", the outer diameter thereof is "L", and the width (thickness) thereof is "h". When the outer diameter of the electric cable used for the secondary windings is decreased, the inner diameter I of the core that is minimally required for assembling the common-mode transformer is also decreased. This makes it possible to downsize the core and thus to downsize the common-mode transformer.

Further, in general, when the outer diameter of an electric cable is large, a minimum bend radius of the electric cable becomes large. A bend radius is defined by "Rc" in FIG. 13, and such a bend radius that is minimum in consideration of damage and performance degradation of the electric cable, is the minimum bend radius. Indicated at "C" in FIG. 13 is a part of the electric cable in the windings of the common-mode transformer, etc. Indicated at 39 in FIG. 13 is a circle having a bend radius Rc. According to the noise filter 50 of Embodiment 1, it is possible to decrease the outer diameter of the electric cable in four windings of each of the common-mode transformers 11a, 11b. Accordingly, the minimum bend radius of each of the electric cables in the primary winding and secondary windings is decreased. This makes it possible to mount the windings of each of the common-mode transformers 11a, 11b on the core 28 in a manner tightly fitted thereto as much as possible, so that gaps created between the core 28 and the windings can be decreased. Thus, according to the noise filter 50 of Embodiment 1, it becomes possible to downsize the common-mode transformers 11a, 11b. When the cable diameter of the electric cable is large, since its bend radius becomes large, it may be difficult to assemble the transformer. However, according to the noise filter 50 of Embodiment 1, since the minimum bend radius for the common-mode transformers 11a, 11b is decreased and thus the common-mode transformers 11a, 11b becomes smaller in size, it is easy to assemble the common-mode transformers 11a, 11b.

The second example of the injection waveform generator 10 will be described. The second example of the injection waveform generator 10 differs from the first example of the injection waveform generator 10 in that a current buffer 14 is added between the output terminal of the amplifier 13 and the output terminal 52. Note that the output terminal of the amplifier 13 is provided at a connection point between the wiring of the op-amp 19 for transferring its output and the resistor 18. The second example of the injection waveform generator 10 can increase its current capacity indicative of a current supply amount, in comparison to the first example of the injection waveform generator 10. The current buffer 14 includes, for example, two transistors BT1, BT2 serially connected to each other. A collector c of the transistor BT1 is connected to the control power supply 15a, an emitter e of the transistor BT1 is connected to an emitter e of the transistor BT2, and a collector c of the transistor BT2 is connected to the control power supply 15b. The output of the amplifier 13 is inputted to bases b of the transistors BT1, BT2, and the emitters e of the transistors BT1, BT2 are connected to the output terminal 52.

In the first example of the injection waveform generator 10 and the second example of the injection waveform generator 10, the amplifier 13 is exemplified as an inverting amplifier circuit; however, the amplifier 13 may be a non-inverting amplifier circuit. The third example of the injection waveform generator 10 shown in FIG. 7 is an example in which the amplifier is a non-inverting amplifier circuit. To the positive side terminal of an op-amp 19, the output of the band limiter 12 is inputted through the resistor 17. To the negative-side input terminal of the op-amp 19, the ground potential is inputted through the resistor 16, and the output of the op-amp 19 is inputted through the resistor 18.

When the resistance values of the resistor 16 and the resistor 18 are defined as r1 and r2, respectively, a gain Gi of the op-amp 19 in the non-inverting amplifier circuit can be represented by a formula (11). Further, the output voltage Vp can be represented by a formula (12).

$$Gi = 1 + r2/r1 \quad (11)$$

$$Vp = Gi \times Vd \quad (12)$$

When the amplifier 13 is a non-inverting amplifier circuit, as shown in FIG. 8, connections to the primary windings of the common-mode transformers 11a, 11b are changed inversely so that the injection voltage Vs as a voltage to be outputted at the secondary winding is set to reduce the common-mode voltage Vci. Note that, in FIG. 8, arrow directions of the output voltage Vp and the injection voltage Vs each indicate a positive direction of the voltage with reference to the ground potential.

It is noted that the voltage detector 7 shown in FIG. 1 is exemplified as being connected to the three-phase power line 5; however, as shown in FIG. 9, it is allowed that the three-phase power line 4 is instead composed of two three-phase power lines 4A, 4B and the voltage detector 7 is connected to either one of the three-phase power lines 4A, 4B. Even in this case, since a common-mode voltage Vci detected from the three-phase power line 4 is equivalent to the common-mode voltage Vci detected from the three-phase power line 5, it suffices to satisfy the formula (3). The three-phase power line 4 shown in FIG. 9 includes u-phase power lines for three phases 4u, v-phase power lines for three phases 4v and w-phase power lines for three phases 4w, and is composed of two three-phase power lines 4A, 4B, namely, three-phase power lines of two-line systems. The three-phase power line 4A includes a u-phase power line for three phases 4Au, a v-phase power line for three phases 4Av and a w-phase power line for three phases 4Aw. The three-phase power line 4B includes a u-phase power line for three phases 4Bu, a v-phase power line for three phases 4Bv and a w-phase power line for three phases 4Bw. The u-phase power lines for three phases 4u are composed of the power line for three phases 4Au and the power line for three phases 4Bu. The v-phase power lines for three phases 4v are composed of the power line for three phases 4Av and the power line for three phases 4Bv, and the w-phase power lines for three phases 4w are composed of the power line for three phases 4Aw and the power line for three phases 4Bw. In FIG. 9, such an example is shown in which the three-phase power line 4B is branched from the three-phase power line 4A at its side near the AC power supply 1, and is then joined to the three-phase power line 4A at its side near the induction motor 3 that is also at the side near the power converter 2. For the sake of simplicity, the three-phase power line 4A is regarded as a mainline system and the three-phase power line 4B is regarded as a branch-line system. In the three-phase power line 4, where appropriate, a part from the end near the AC power supply 1 until just before the branch point and a part from just after the joined point until the end near the induction motor 3, are assumed to belong to the three-phase power line 4A as the mainline system.

In FIG. 1 and FIG. 8, the common-mode transformers 11a, 11b are exemplified as being inserted in the three-phase power lines 5A, 5B, respectively; however, as shown in FIG. 9, the common-mode transformers 11a, 11b may be inserted in the three-phase power lines 4A, 4B, respectively. Furthermore, the relative positions of the common-mode transformers 11a, 11b and the voltage detector 7 may be exchanged as shown in FIG. 11. The noise filter 50 shown in FIG. 1 as a first example has a feedforward configuration, whereas the noise filter 50 shown in FIG. 11 as a fourth example has a feedback configuration.

Further, although the three-phase power line 5 shown in FIG. 1 is composed of two three-phase power lines 5A, 5B, it is allowed that the three-phase power line 5 is composed of three or more three-phase power lines and that common-mode transformers are connected to the respective three-phase power lines in the three-phase power line 5 composed of three or more three-phase power lines. In FIG. 14, such an example is shown in which the noise filter 50 includes three common-mode transformers 11a, 11b, 11c and the three-phase power line 5 composed of three three-phase power lines 5A, 5B, 5C, namely, three-phase power lines of three-line systems. The three-phase power line 5 shown in FIG. 14 includes u-phase power lines for three phases 5u, v-phase power lines for three phases 5v and w-phase power line for three phase 5w, and is composed of three three-phase power lines 5A, 5B, 5C. The three-phase power lines 5A, 5B are the same as previously mentioned. The three-phase power line 5C includes a u-phase power line for three phases 5Cu, a v-phase power line for three phases 5Cv and a w-phase power line for three phases 5Cw. The u-phase power lines for three phases 5u are composed of the power line for three phases 5Au, the power line for three phases 5Bu and the power line for three phases 5Cu. The v-phase power lines for three phases 5v are composed of the power line for three phases 5Av, the power line for three phases 5Bv and the power line for three phases 5Cv, and the w-phase power lines for three phases 5w are composed of the power line for three phases 5Aw, the power line for three phases 5Bw and the power line for three phases 5Cw.

Although the voltage divider circuit 9 is exemplified as including the capacitor 91 and the resistors 92, 93, the voltage divider circuit 9 is not limited to such an example. The voltage divider circuit 9 may be configured solely with the capacitor 91 formed of two serially-connected capacitors, or may be configured solely with the transistors 92, 93, or further, may be configured with increased numbers of capacitors and the resistors.

As described above, the noise filter 50 of Embodiment 1 is such a noise filter which reduces the common-mode voltage Vci produced by the power converter 2 that performs power conversion using switching operations of the semiconductor elements Q1 to Q6. The noise filter 50 comprises: the voltage detector 7 that detects the common-mode voltage Vci produced by the power converter 2; the voltage divider circuit 9 that outputs the divided voltage Vd divided from the common-mode voltage Vci detected by the voltage detector 7; the multiple common-mode transformers 11a, 11b that are connected separately to the respective power lines (three-phase power lines 5A, 5B) of multiline systems connected in parallel relation to each other to an input or output of the power converter 2, and that superimpose a superimposing voltage (injection voltage Vs) having an opposite polarity to the common-mode voltage Vci, on each of the power lines (three-phase power lines 5A, 5B) of multiline systems; and the injection waveform generator 10 that generates the output voltage Vp to be outputted to the primary sides of the multiple common-mode transformers 11a, 11b, on the basis of the divided voltage Vd. The injection waveform generator 10 generates as the output voltage Vp, a voltage with which a difference between the superimposing voltage (injection voltage Vs) to be superimposed on each of the power lines (three-phase power lines 5A, 5B) and the common-mode voltage Vci is within the allowable value Vto. According to this configuration, the noise filter 50 of Embodiment 1 includes the multiple common-mode transformers 11a, 11b that are connected separately to the respective power lines (three-phase power lines 5A, 5B) of multiline systems, and the injection waveform generator 10 generates the output voltage Vp with which a difference between the superimposing voltage (injection voltage Vs) to be superimposed on each of the power lines (three-phase power lines 5A, 5B) and the common-mode voltage Vci is within the allowable value Vto. This allows to employ small-diameter electric cables for the secondary windings of the common-mode transformers 11a, 11b and accordingly, the core to be used can be downsized. Thus, it is possible, even when the output current of the power converter 2 is large, to reduce the common-mode voltage Vci by using small-size common-mode transformers 11a, 11b.

Embodiment 2

Figure 15:
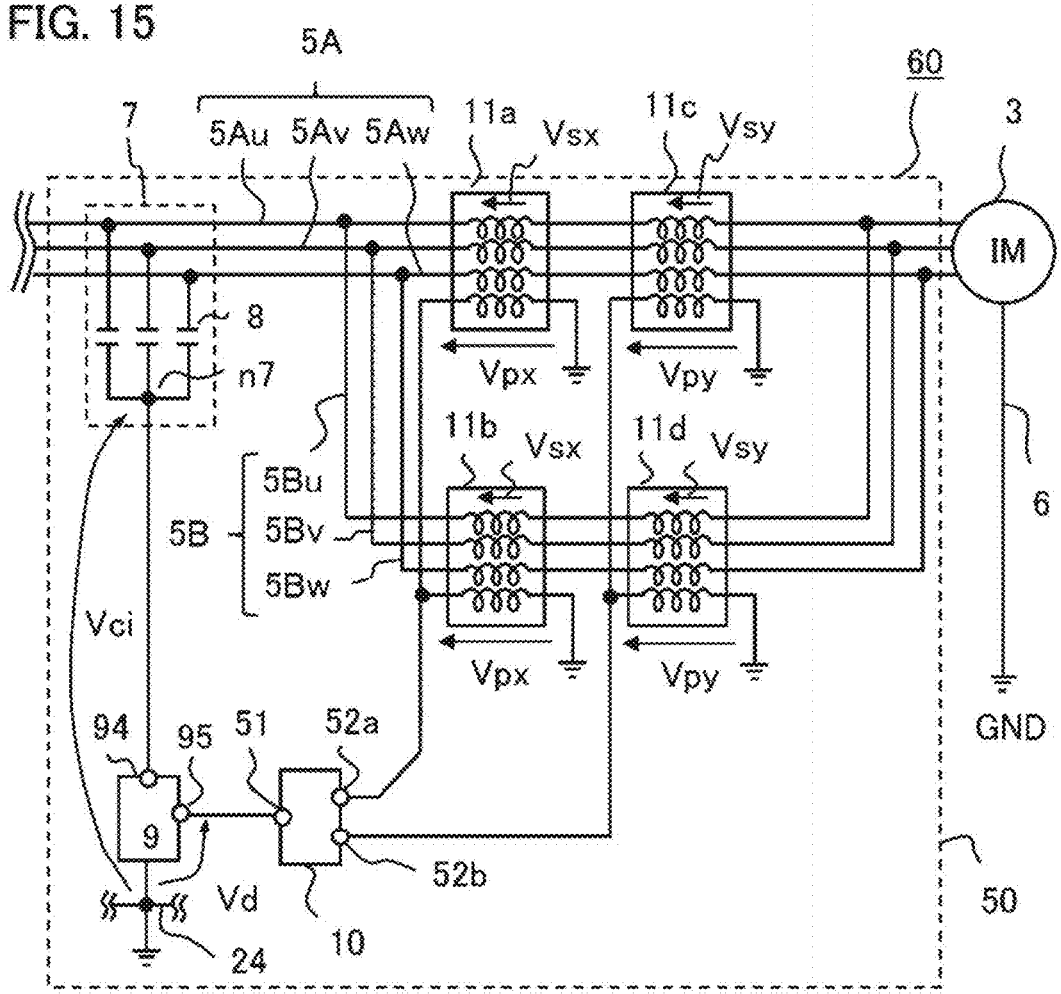
FIG. 15 is a diagram showing a configuration of a first noise filter and an electric motor drive system according to Embodiment 2.
Figure 16:
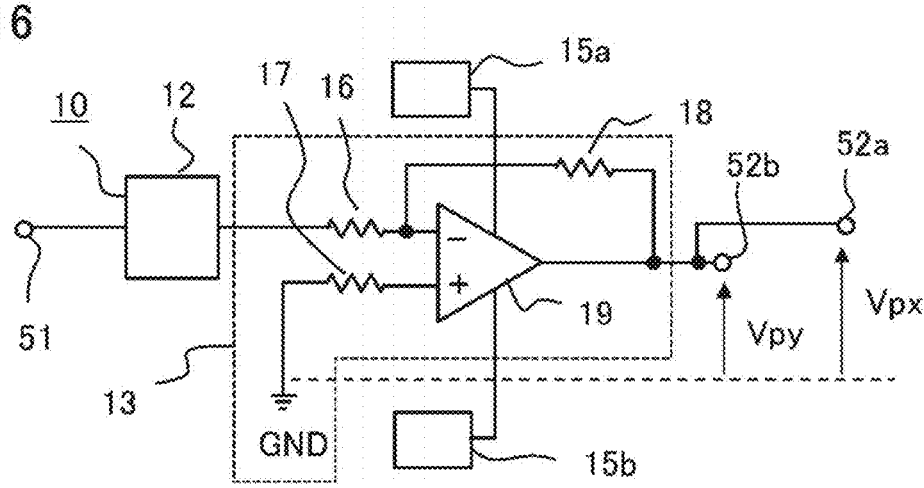
FIG. 16 is a diagram showing a first example of an injection waveform generator in FIG. 15.
Figure 17:
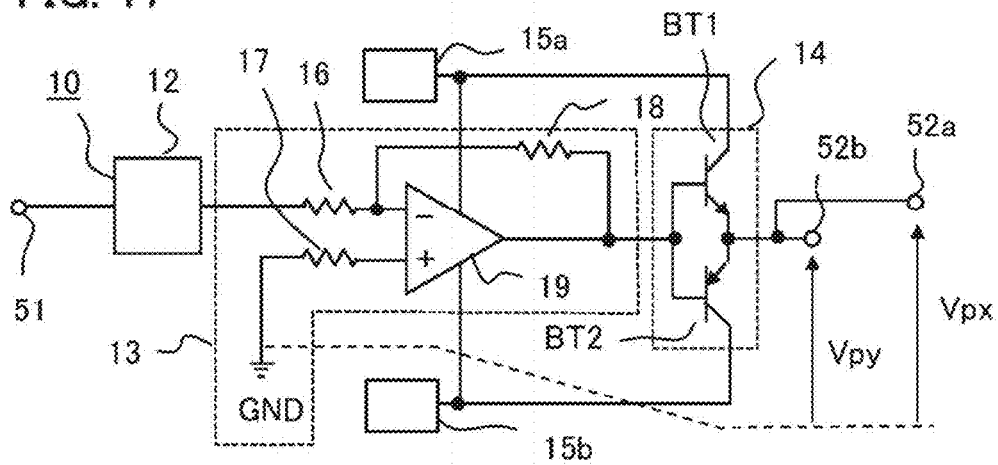
FIG. 17 is a diagram showing a second example of the injection waveform generator in FIG. 15.
Figure 18:
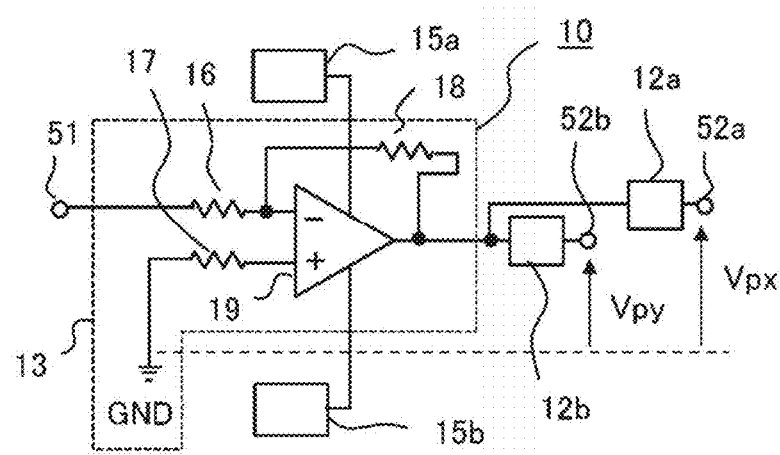
FIG. 18 is a diagram showing a third example of the injection waveform generator in FIG. 15.
Figure 19:
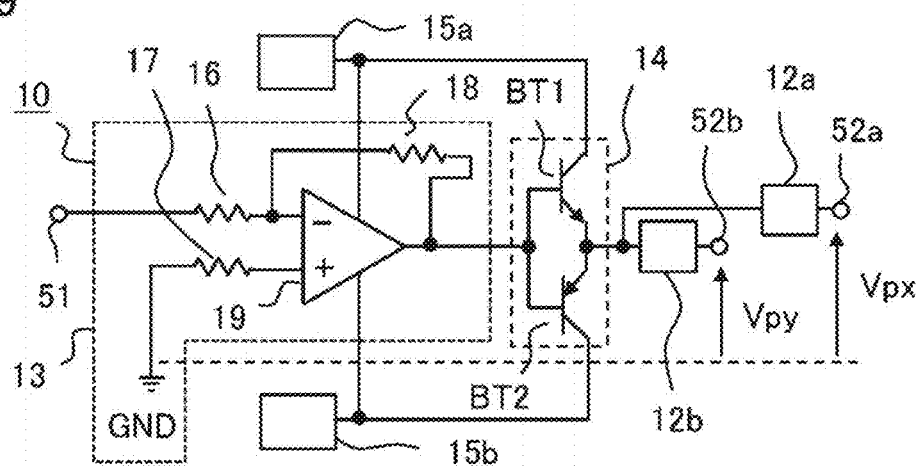
FIG. 19 is a diagram showing a fourth example of the injection waveform generator in FIG. 15.
Figure 20:
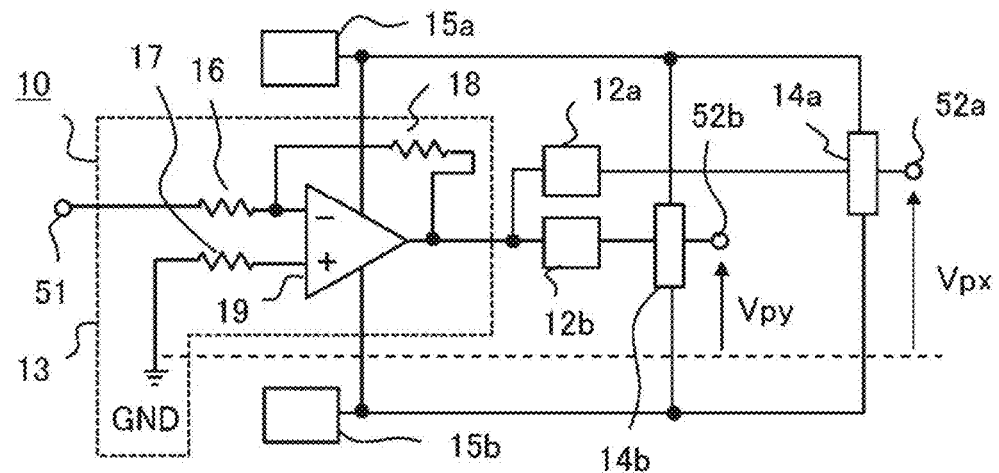
FIG. 20 is a diagram showing a fifth example of the injection waveform generator in FIG. 15.
Figure 21:
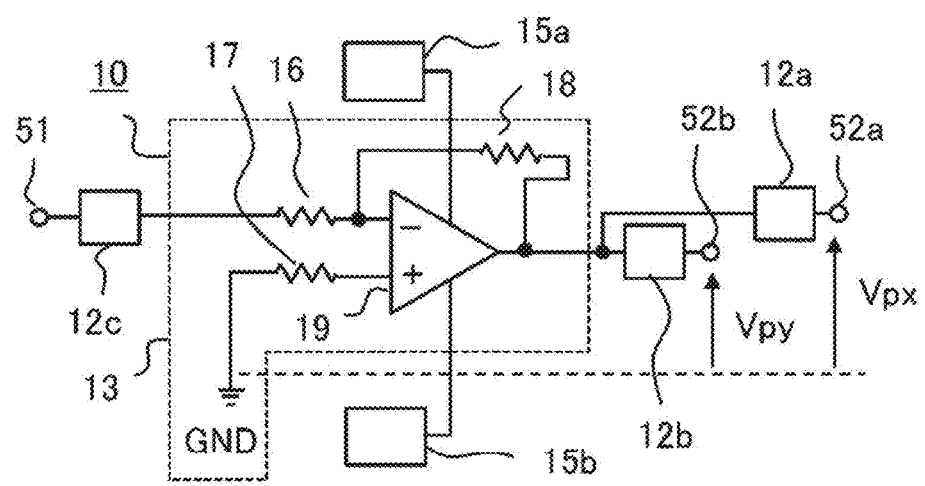
FIG. 21 is a diagram showing a sixth example of the injection waveform generator in FIG. 15.
Figure 22:
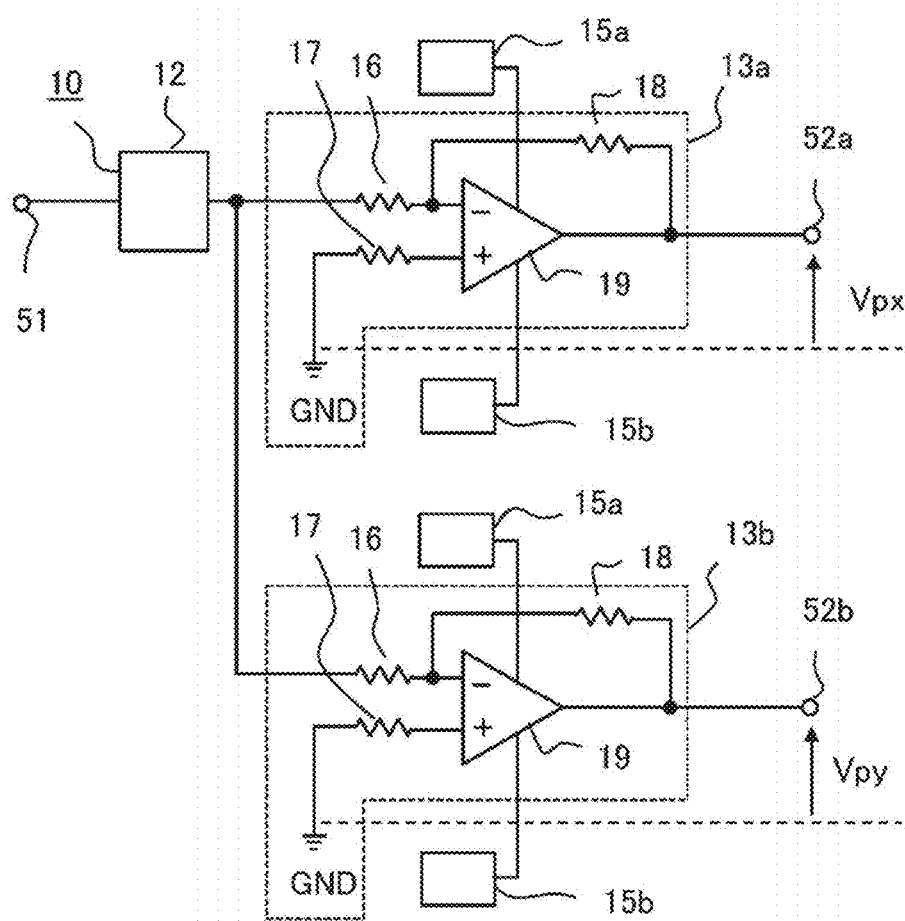
FIG. 22 is a diagram showing a seventh example of the injection waveform generator in FIG. 15.
Figure 23:
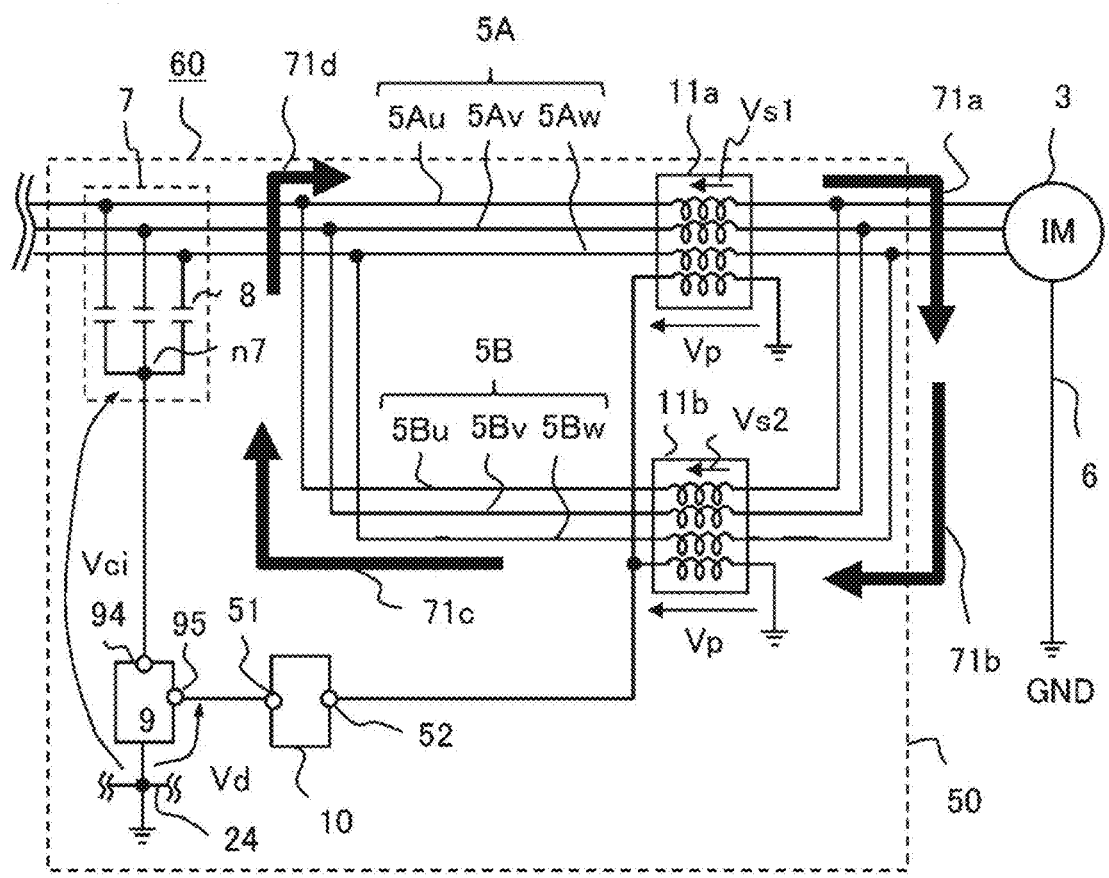
FIG. 23 is a diagram illustrating a circulation current.
Figure 24:
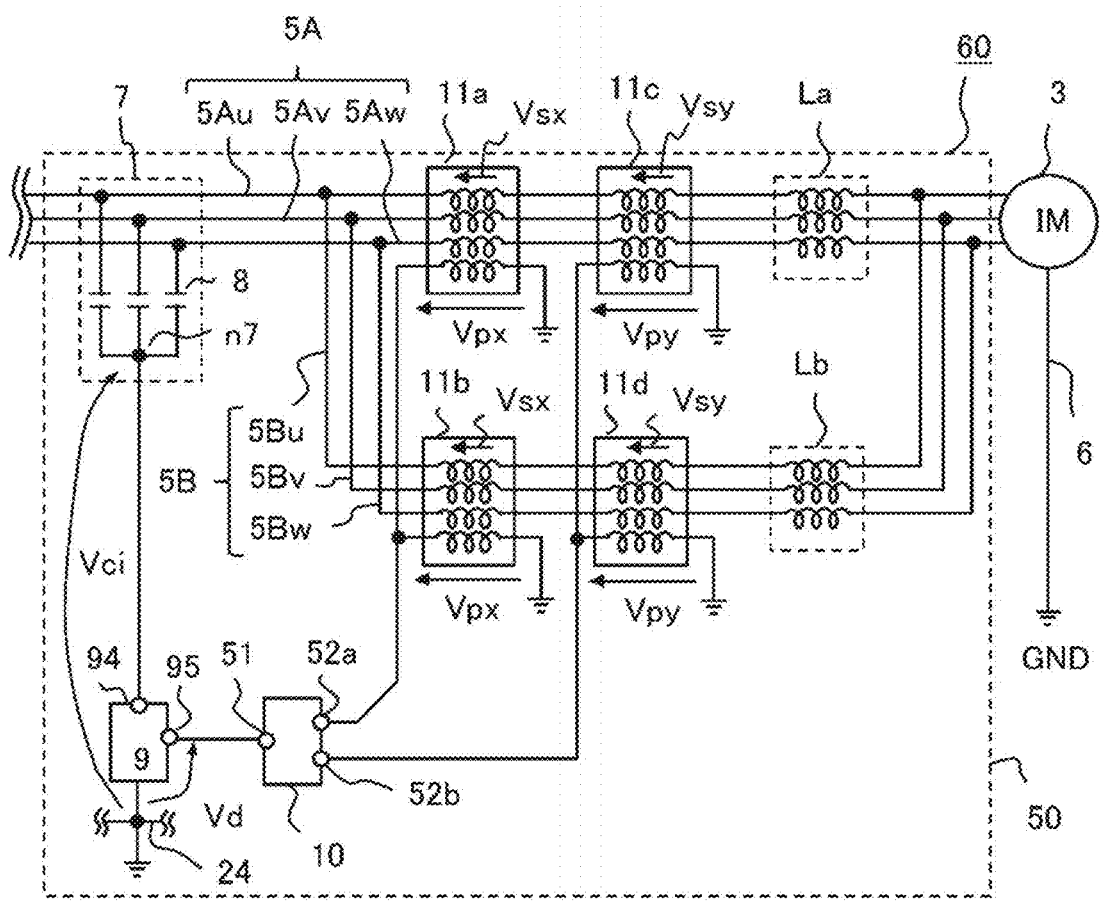
FIG. 24 is a diagram showing a configuration of a second noise filter and an electric motor drive system according to Embodiment 2.
Figure 25:
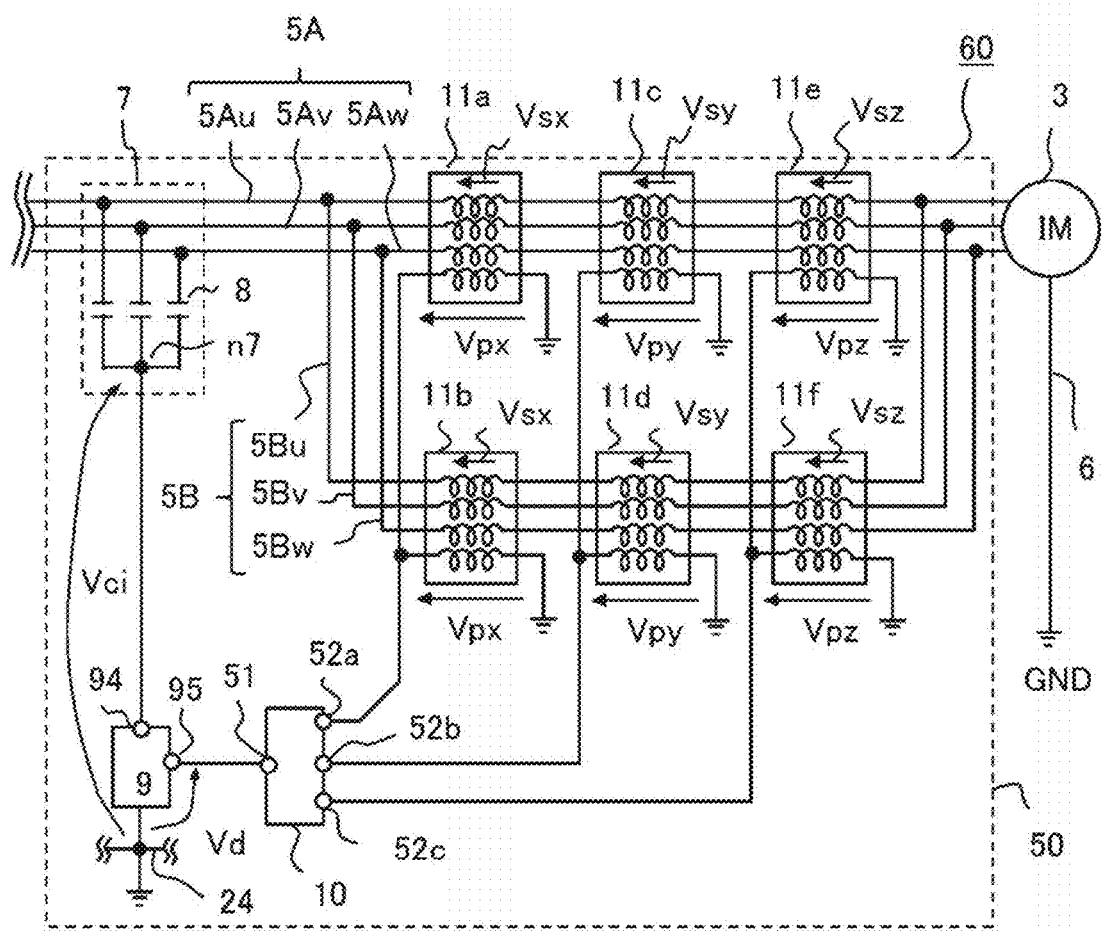
FIG. 25 is a diagram showing a configuration of a third noise filter and an electric motor drive system according to Embodiment 2.
Figure 26:
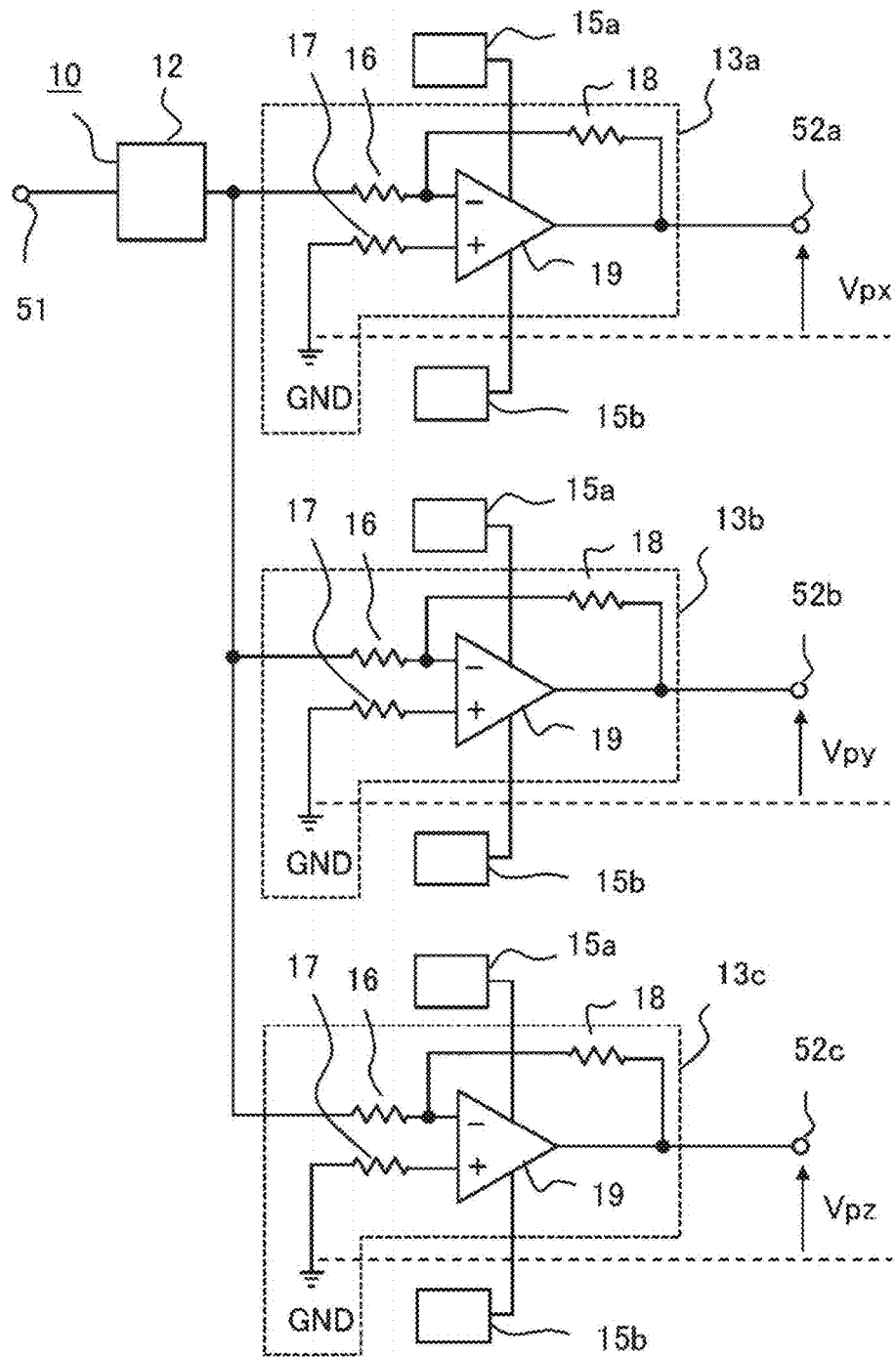
FIG. 26 is a diagram showing an injection waveform generator in FIG. 25.

FIG. 15 is a diagram showing a configuration of a first noise filter and an electric motor drive system according to Embodiment 2. FIG. 16 is a diagram showing a first example of an injection waveform generator in FIG. 15, and FIG. 17 is a diagram showing a second example of the injection waveform generator in FIG. 15. FIG. 18 is a diagram showing a third example of the injection waveform generator in FIG. 15, and FIG. 19 is a diagram showing a fourth example of the injection waveform generator in FIG. 15. FIG. 20 is a diagram showing a fifth example of the injection waveform generator in FIG. 15, and FIG. 21 is a diagram showing a sixth example of the injection waveform generator in FIG. 15. FIG. 22 is a diagram showing a seventh example of the injection waveform generator in FIG. 15. FIG. 23 is a diagram illustrating a circulation current. FIG. 24 is a diagram showing a configuration of a second noise filter and an electric motor drive system according to Embodiment 2. FIG. 25 is a diagram showing a configuration of a third noise filter and an electric motor drive system according to Embodiment 2, and FIG. 26 is a diagram showing an injection waveform generator in FIG. 25.

A noise filter 50 of Embodiment 2 differs from the noise filter 50 of Embodiment 1 in that plural common-mode transformers are connected to each one of the three-phase power linens 5A, 5B. The first noise filter 50 of Embodiment 2 shown in FIG. 15 is an example in which two common-mode transformers 11a, 11c are connected to the three-phase power line 5A, and two common-mode transformers 11b, 11d are connected to the three-phase power line 5B. The first example of the injection waveform generator 10 shown in FIG. 16 differs from the injection waveform generator 10 shown in FIG. 5 in having two output terminals 52a, 52b. The first example of the injection waveform generator 10 of Embodiment 2 outputs an output voltage Vpx as a first output voltage from the output terminal 52a, and outputs an output voltage Vpy as a second output voltage from the output terminal 52b. Note that, in FIG. 16, the wiring 24 placed at the ground potential is omitted from illustration. Also, in FIG. 17 to FIG. 22, the wiring 24 placed at the ground potential is omitted from illustration.

Description will be made mainly on differences from the noise filter 50 of Embodiment 1. The gain Gi of an op-amp 19 of Embodiment 2 is determined depending on the dividing ratio Rv of the voltage divider circuit 9, the turn ratio Rr of the common-mode transformers 11a, 11b, 11c, 11d, and a connected number Nt of transformers connected to each one of the three-phase power lines configured as multiline systems. In the example of FIG. 15, "Nt" is 2. The gain Gi, the dividing ratio Rv, the turn ratio Rr and the connected number Nt of transformers are set so that:

a total injection voltage Vst as voltages superimposed through the secondary windings of the common-mode transformers 11a, 11c, on the u-phase, v-phase and w-phase of the three-phase power lines 5A, and a total injection voltage Vst as a voltage superimposed through the secondary windings of the common-mode transformers 11b, 11d, on the u-phase, v-phase and w-phase of the three-phase power lines 5B, each reduce the common-mode voltage Vci, namely, a following formula (13) is satisfied.

In FIG. 15, such an example is shown in which the common-mode transformer 11a and the common-mode transformer 11b have the same configurations, and the common-mode transformer 11c and the common-mode transformer 11d have the same configurations. Here, the common-mode transformers having the same configurations mean that these common-mode trans-formers are configured with the same core material, the same core outer diameter, the same core inner diameter, the same core cross-section area and the same turn ratio. Accordingly, the total injection voltage Vst superimposed on the three-phase power line 5A and the total injection voltage Vst superimposed on the three-phase power line 5B are the same voltage.

$$|Vci-Vst| \leq Vto \quad (13)$$

The formula (13) indicates that an absolute value of the difference between the common-mode voltage Vci and the total injection voltage Vst for each of the three-phase power lines 5A, 5B is within the allowable value Vto. The total injection voltage Vst is represented by a formula (14), which is a voltage resulting from summation of injection voltages Vsx, Vsy that are induced by the common-mode transformers connected to each one of the three-phase power lines 5A, 5B configured as multiline systems. When the sum of injection voltages superimposed on either one of the three-phase power lines 5A, 5B is defined as Vsa or Vsb, a formula (15) is established between the sum and the total injection voltage Vst.

$$Vst = Vsx + Vsy \quad (14)$$

$$Vsa = Vsb = Vst \quad (15)$$

When respective injection voltages of the common-mode transformers connected to each one of the three-phase power lines 5A, 5B configured as multiline systems, are equal to each other, namely, when the injection voltage Vsx and the injection voltage Vsy in FIG. 15 are the same injection voltages Vs, the total injection voltage Vst is represented by a formula (16) by using the connected number Nt of transformers.

$$Vst = Nt \times Vs \quad (16)$$

With respect to a given value of the common-mode voltage Vci, the larger the connected number Nt of transformers connected per one three-phase power line, the smaller can be the voltage to be inputted to one common-mode transformer, namely, the output voltages Vpx, Vpy of the injection waveform generator 10, as well as the injection voltages Vsx, Vsy as voltages to be outputted at the secondary windings of the common-mode transformers. Because of including plural common-mode transformers per one three-phase power line, the noise filter 50 of Embodiment 2 can superimpose the total injection voltage Vst by using the common-mode transformers 11a, 11b, 11c, 11d that are smaller in size than those of the noise filter 50 of Embodiment 1, on each of the u phases, v phases and w phases of the three-phase power line 5.

According to the noise filter 50 of Embodiment 2, since plural common-mode transformers are connected to each one of the three-phase power lines 5A, 5B, it is possible to decrease the injection voltage Vsx/Vsy per one common-mode transformer, required for satisfying the formula (13). Accordingly, a voltage-time product per one common-mode transformer becomes smaller. In general, the smaller the voltage-time product, the smaller the cross-section area of the core used in the common-mode transformer. Thus, the noise filter 50 of Embodiment 2 makes it possible to downsize the common-mode transformer.

FIG. 23 is a diagram illustrating the circulation current in the case where the three-phase power line 5 branches into two-line systems and they are then rejoined. In FIG. 23, such a case is shown where, with the configuration of the first noise filter and the electric motor drive system according to Embodiment 1, the common-mode transformers 11a, 11b inject in the three-phase power lines 5A, 5B, injection voltages Vs1, Vs2 having different voltage values, respectively. When the three-phase power line 5 is composed of the three-phase power lines 5A, 5B of multiline systems, and injection voltages are superimposed using the common-mode transformers 11a, 11b connected to the respective three-phase power lines 5A, 5B, if one of the common-mode transformers has failed, such a difference occurs in total injection voltage between the three-phase power lines 5A, 5B. When there is a difference in total injection voltage between the three-phase power lines 5A, 5B, for example, when, due to the injection voltages Vs1, Vs2, the voltage at the three-phase power line 5A becomes lower than the voltage at the three-phase power line 5B, a current circulating through the three-phase power lines 5A, 5B, flows as shown in FIG. 23 in the direction indicated by arrows 71a, 71b, 71c, 71d.

According to the noise filter 50 of Embodiment 2, the injection voltages Vsx, Vsy are outputted by plural common-mode transformers connected to each one of the three-phase power lines 5A, 5B. Thus, the injection voltage Vsx or injection current Vsy per one common-mode transformer becomes smaller, so that if, due to failure, one common-mode transformer 11a becomes unable to output a proper voltage, it is possible to make a voltage difference that may occur between the total injection voltages Vsa, Vsb for the three-phase power lines 5A, 5B, smaller than that according to the noise filter 50 of Embodiment 1. Therefore, according to the noise filter 50 of Embodiment 2, if one common-mode transformer 11a has failed, the voltage difference that occurs between the total injection voltages Vsa, Vsb for the three-phase power lines 5A, 5B, is smaller than that according to the noise filter 50 of Embodiment 1. This makes it possible to reduce the circulation current caused by the voltage difference and circulating through the three-phase power lines 5A, 5B, in comparison to the noise filter 50 of Embodiment 1.

Further, as exemplified by the second noise filter 50 of Embodiment 2 shown in FIG. 24, when common-mode choke coils La, Lb having the same configurations are connected to the three-phase power lines 5A, 5B, respectively, it is possible to reduce the circulation current caused by the voltage difference between the total injection voltages Vsa, Vsb for the three-phase power lines 5A, 5B. The second noise filter 50 of Embodiment 2 is an example including the voltage detector 7, the voltage divider circuit 9, the injection waveform generator 10, the common-mode transformers 11a, 11b and the common-mode choke coils La, Lb.

In order to reduce the circulation current in the case where the three-phase power line 5 branches into two-line systems and they are then rejoined, it suffices to make the total injection voltage Vsa that is a total injection voltage Vst superimposed on the three-phase power line 5A as a mainline system, and the total injection voltage Vsb that is a total injection voltage Vst superimposed on the three-phase power line 5B as a branch-line system, equal to each other. For example, it is possible to make the total injection voltage Vsa and the total injection voltage Vsb equal to each other, by setting all of the common-mode transformers connected to the mainline system and the branch-line system, to be the same in core material, core outer diameter, core inner diameter, core cross-section area and the turn ratio. In the example of FIG. 15, the common-mode transformers 11a, 11b, 11c, 11d are set to be the same in core material, core outer diameter, core inner diameter, core cross-section area and the turn ratio, so that the output voltage Vpx and the output voltage Vpy that are equal to each other are inputted to the common-mode transformers 11a, 11b, 11c, 11d. Thus, the noise filter 50 of Embodiment 2 can superimpose the injection voltage Vsx and the injection voltage Vsy that are equal to each other, on each of the three-phase power lines 5A, 5B.

Further, when equal numbers of common-mode transformers having the same configurations are connected respectively to the mainline system and the branch-line system as described above, it is possible to make the total injection voltage Vsa and the total injection voltage Vsb equal to each other. It is allowed, for example, that the common-mode transformers 11a, 11b are configured under first set conditions of the same core material, core outer diameter, core inner diameter, core cross-section area and turn ratio, while the common-mode transformers 11c, 11d are configured under second set conditions of core material, core outer diameter, core inner diameter, core cross-section area and turn ratio, that are common to them but different to the first set conditions. Namely, the common-mode transformer 11a, 11b and the common-mode transformer 11c, 11d may be different from each other in at least one of core material, core outer diameter, core inner diameter, core cross-section area and turn ratio. For the case where the voltage values of the output voltages Vpx, Vpy are different from each other, the seventh example of the injection waveform generator 10 shown in FIG. 22 may be used, for example. The seventh example of the injection waveform generator 10 is an example in which individual amplifiers 13a, 13b are provided for the output terminals 52a, 52b, respectively. For example, when the gain of the amplifier 13a and the gain of the amplifier 13b are set differently, the seventh example of the injection waveform generator 10 can output the output voltages Vpx, Vpy whose voltage values are different from each other.

The second example of the injection waveform generator 10 shown in FIG. 17 differs from the injection waveform generator 10 shown in FIG. 6 in having two output terminals 52a, 52b. The second example of the injection waveform generator 10 of Embodiment 2 outputs the output voltage Vpx from the output terminal 52a and outputs the output voltage Vpy from the output terminal 52b. Further, the second example of the injection waveform generator 10 of Embodiment 2 differs from the first example of the injection waveform generator 10 in that the current buffer 14 is added between the output terminal of the amplifier 13 and the output terminals 52a, 52b. Because of the current buffer 14, the second example of the injection waveform generator 10 of Embodiment 2 can increase the current capacity indicative of a current supply amount, in comparison to the first example of the injection waveform generator 10.

The third example of the injection waveform generator 10 shown in FIG. 18 differs from the first example of the injection waveform generator 10 shown in FIG. 16 in that the band limiter 12 is not placed on the side near the input terminal 51 and instead, band limiters 12a, 12b are disposed between the output terminal of the amplifier 13 and the respective output terminals 52a, 52b. The frequency band of the band limiter 12a and the frequency band of the band limiter 12b may be the same or different. When the frequency band of the band limiter 12a and the frequency band of the band limiter 12b are different, it is possible to output the output voltages Vpx, Vpy in different frequency bands.

The fourth example of the injection waveform generator 10 shown in FIG. 19 differs from the third example of the injection waveform generator 10 shown in FIG. 18 in that the current buffer 14 is added between the output terminal of the amplifier 13 and the input sides of the band limiters 12a, 12b. Because of the current buffer 14, the fourth example of the injection waveform generator 10 of Embodiment 2 can increase the current capacity indicative of a current supply amount, in comparison to the third example of the injection waveform generator 10 of Embodiment 2.

Although the fourth example of the injection waveform generator 10 shown in FIG. 19 is an example in which the current buffer 14 is disposed between the output terminal of the amplifier 13 and the input sides of the band limiters 12a, 12b, instead, current buffers 14 may be disposed between the output sides of the band limiters 12a, 12b and the output terminals 52a, 52b. The fifth example of the injection waveform generator 10 shown in FIG. 20 differs from the third example of the injection waveform generator 10 shown in FIG. 18 in that a current buffer 14a is added between the output side of the band limiter 12a and the output terminal 52a, and a current buffer 14b is added between the output side of the band limiter 12b and the output terminal 52b. Because of the current buffers 14a, 14b, the fifth example of the injection waveform generator 10 of Embodiment 2 can increase the current capacity indicative of a current supply amount, in comparison to the third example of the injection waveform generator 10 of Embodiment 2.

The sixth example of the injection waveform generator 10 shown in FIG. 21 differs from the third example of the injection waveform generator 10 shown in FIG. 18 in that a band limiter 12c is disposed between the input terminal 51 and the input side of the amplifier 13. Since the sixth example of the injection waveform generator 10 of Embodiment 2 further includes the band limiter 12c on its input side, the band limiters 12a, 12b on the output side can be downsized. Accordingly, by using small-size band limiters 12a, 12b, 12c, the sixth example of the injection waveform generator 10 of Embodiment 2 can reduce the band-limiter total power consumption in comparison to the third example of the injection waveform generator 10 of Embodiment 2 including two band limiters 12a, 12b.

Also in the second to sixth examples of the injection waveform generator 10, like in the seventh example of the injection waveform generator 10 in FIG. 22, individual amplifiers 13a, 13b may be provided for the output terminals 52a, 52b, respectively. When the second example of the injection waveform generator 10 is assumed, the current buffer 14 is disposed between the amplifier 13a and the output terminal 52a, and another current buffer 14 is disposed between the amplifier 13b and the output terminal 52b. When the third and sixth examples of the injection waveform generator 10 are assumed, the band limiter 12a is disposed between the amplifier 13a and the output terminal 52a, and the band limiter 12b is disposed between the amplifier 13b and the output terminal 52b. When the fourth example of the injection waveform generator 10 is assumed, the current buffer 14 and the band limiter 12a are disposed between the amplifier 13a and the output terminal 52a, and another current buffer 14 and the band limiter 12b are disposed between the amplifier 13b and the output terminal 52b. When the fifth example of the injection waveform generator 10 is assumed, the band limiter 12a and the current buffer 14a are disposed between the amplifier 13a and the output terminal 52a, and the band limiter 12b and the current buffer 14b are disposed between the amplifier 13b and the output terminal 52b.

In FIG. 15, such a case is shown where the injection waveform generator 10 has two output terminals, and two common-mode transformers are provided for each one of the three-phase power lines 5A, 5B; however, the number of common-mode transformers is not limited thereby. For example, as shown in FIG. 25, it is allowed that three common-mode transformers are connected to each one of the three-phase power lines 5A, 5B, and output voltages Vpx, Vpy, Vpz are outputted from output terminals 52a, 52b, 52c of an injection waveform generator 10. Specifically, three common-mode transformers 11a, 11c, 11e are connected to the three-phase power line 5A, and three common-mode transformers 11b, 11d, 11f are connected to the three-phase power line 5B. In this case, a total injection voltage Vst is represented by a formula (17), and injection voltages Vsx, Vsy, Vsz are set so as to satisfy the formula (17).

$$Vst=Vsx+Vsy+Vsz \qquad (17)$$

In FIG. 26, an example of the injection waveform generator 10 to be employed for the third noise filter 50 of Embodiment 2 is shown. This example results from adding an amplifier 13c and an output terminal 52c to the seventh example of the injection waveform generator 10 shown in FIG. 22. The injection waveform generator 10 shown in FIG. 26 is not limitative, and may instead be such an exemplary generator resulting from structurally extending one of the second to sixth examples of the injection waveform generator 10 shown in FIG. 17 to FIG. 21 so as to have the amplifiers 13a, 13b, and further adding the amplifier 13c and the output terminal 52c thereto. Note that, when this applies to the third to sixth examples of the injection waveform generator 10 shown in FIG. 18 to FIG. 21, a band limiter or the like is connected also on the side where the output terminal 52c to be added is placed, so as to make a condition on that side similar to those on the sides where the output terminals 52a, 52b are placed.

As described above, the noise filter 50 of Embodiment 2 includes an equal number of plural common-mode transformers for each one of the three-phase power lines 5A, 5B and, like in Embodiment 1, allows to employ small-diameter electric cables for the secondary windings of the common-mode transformers. Accordingly, the core to be used can be downsized and thus, it is possible to configure the noise filter with small-size common-mode transformers, even when the output current of the power converter 2 is large. Further, since the noise filter 50 of Embodiment 2 includes the equal number of plural common-mode transformers for each one of the three-phase power lines 5A, 5B to thereby reduce the common-mode voltage Vci by using the total injection voltage Vst resulting from summation of the injection voltages Vs of the plural common-mode transformers connected to one three-phase power line, the injection voltage Vs per one common-mode transformer becomes smaller. As a result, a voltage-time product per one common-mode transformer becomes smaller, so that it is possible to downsize the core to be used in the common-mode transformer and thus to downsized the common-mode transformer. Further, according to the noise filter 50 of Embodiment 2, if one common-mode transformer has failed and becomes unable to inject an intended voltage, it is possible to reduce the circulation current that is due to the occurrence of a voltage difference between the total injection voltage Vsa for the three-phase power line 5A and the total injection voltage Vsb for the three-phase power line 5B, and that circulates through the three-phase power lines 5A, 5B.

Embodiment 3

Figure 27:
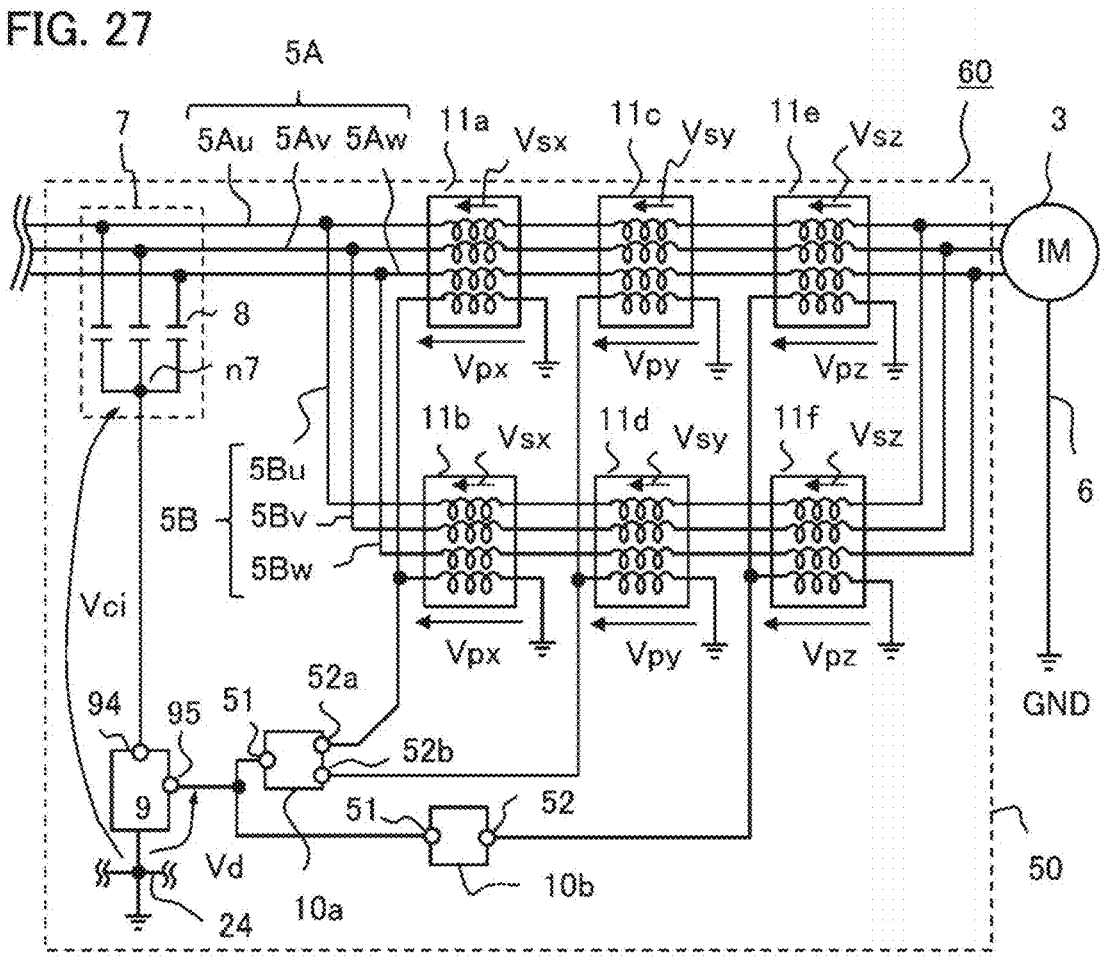
FIG. 27 is a diagram showing a configuration of a first noise filter and an electric motor drive system according to Embodiment 3.
Figure 28:
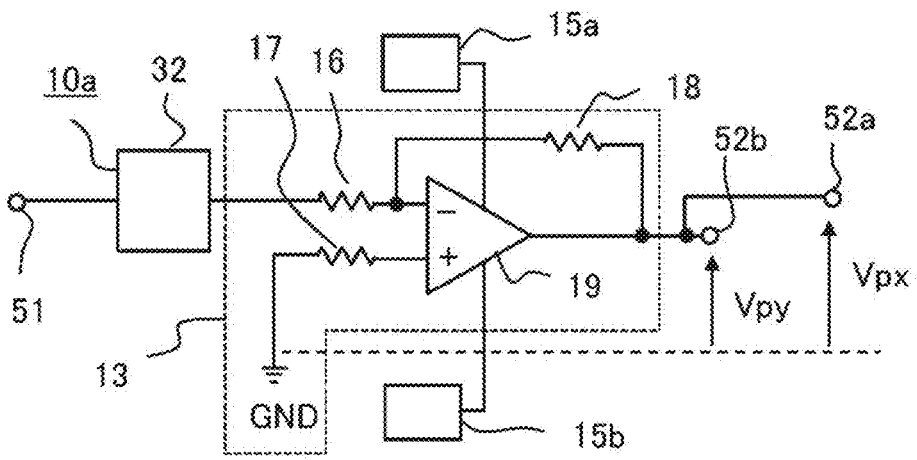
FIG. 28 is a diagram showing a first example of a first injection waveform generator in FIG. 27.
Figure 29:
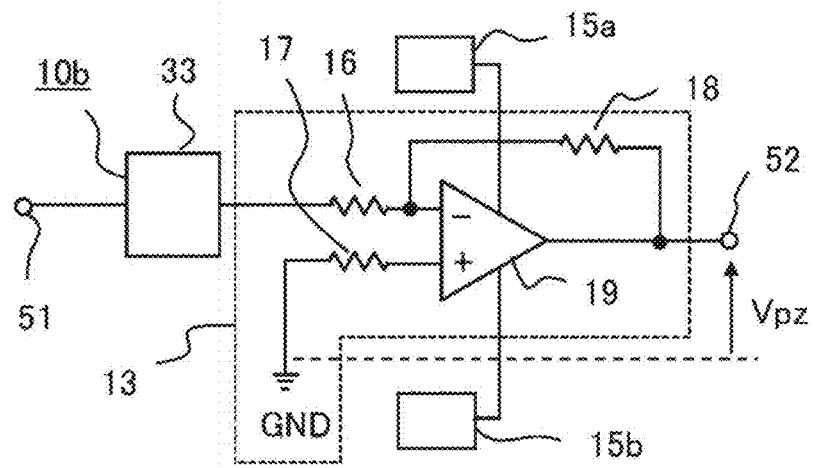
FIG. 29 is a diagram showing a first example of a second injection waveform generator in FIG. 27.
Figure 30:
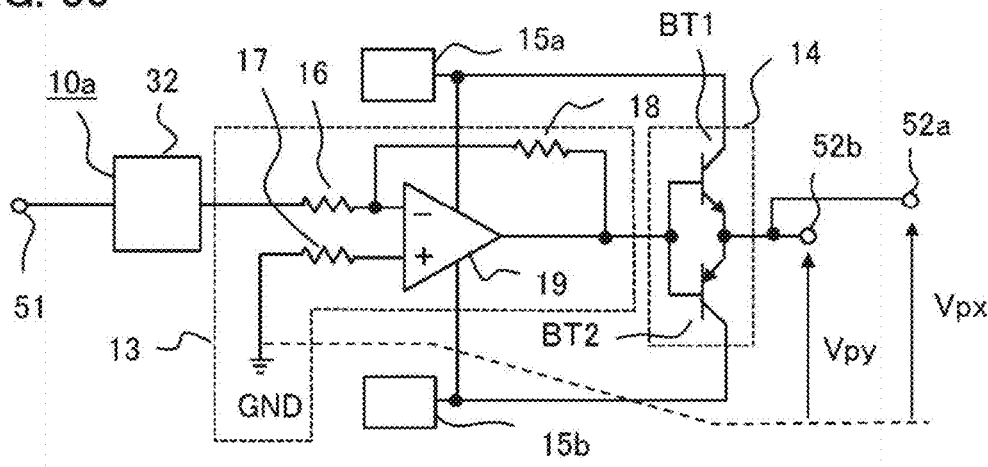
FIG. 30 is a diagram showing a second example of the first injection waveform generator in FIG. 27.
Figure 31:
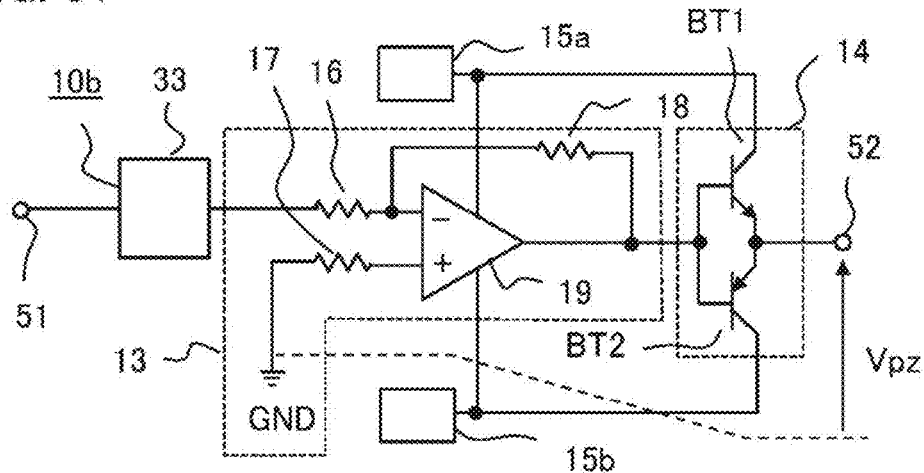
FIG. 31 is a diagram showing a second example of the second injection waveform generator in FIG. 27.
Figure 32:
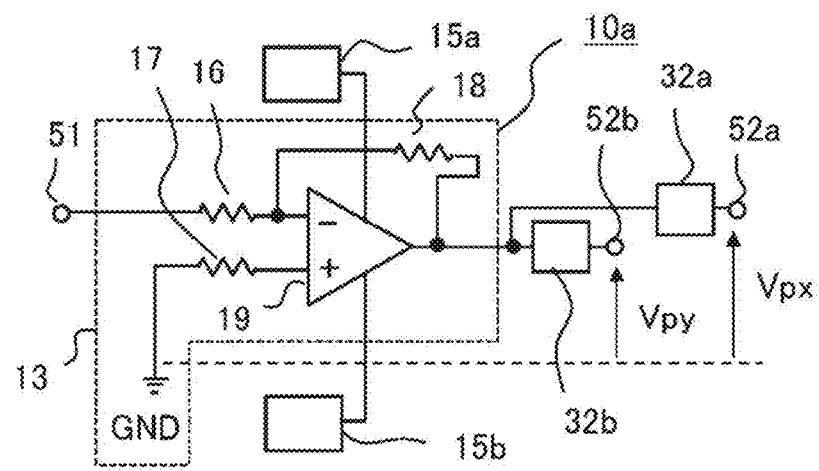
FIG. 32 is a diagram showing a third example of the first injection waveform generator in FIG. 27.
Figure 33:
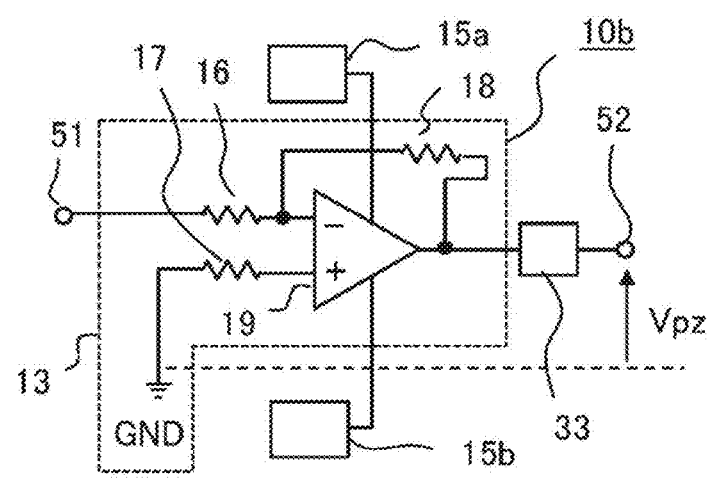
FIG. 33 is a diagram showing a third example of the second injection waveform generator in FIG. 27.
Figure 34:
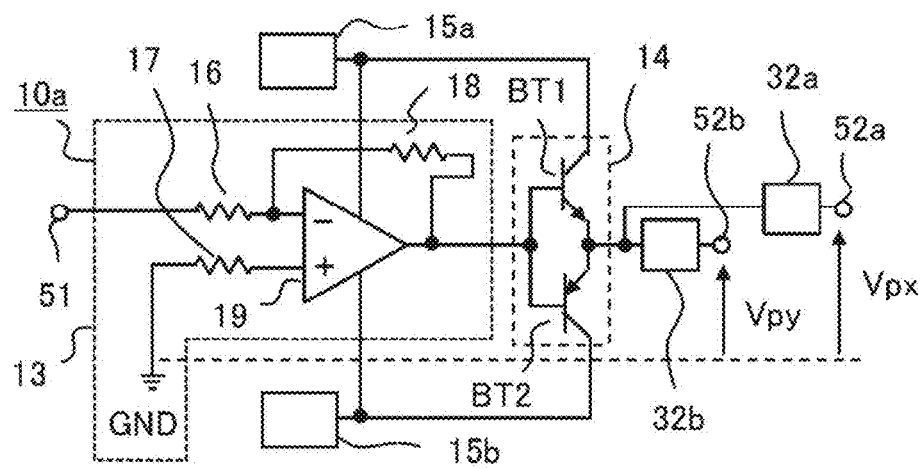
FIG. 34 is a diagram showing a fourth example of the first injection waveform generator in FIG. 27.
Figure 35:
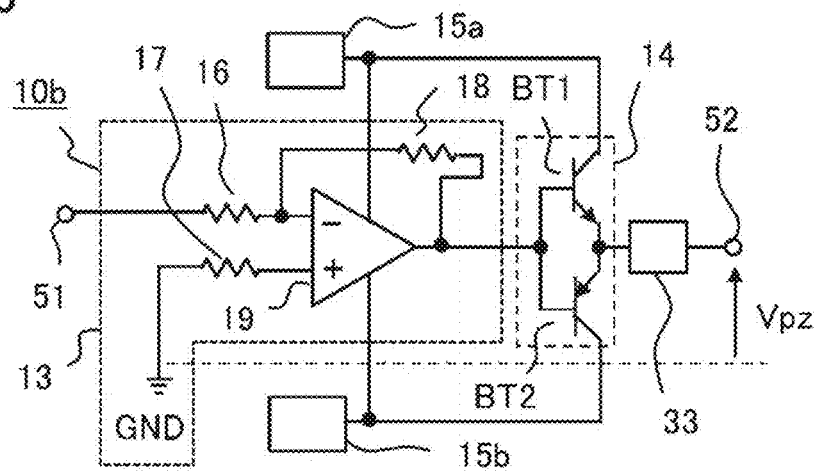
FIG. 35 is a diagram showing a fourth example of the second injection waveform generator in FIG. 27.
Figure 36:
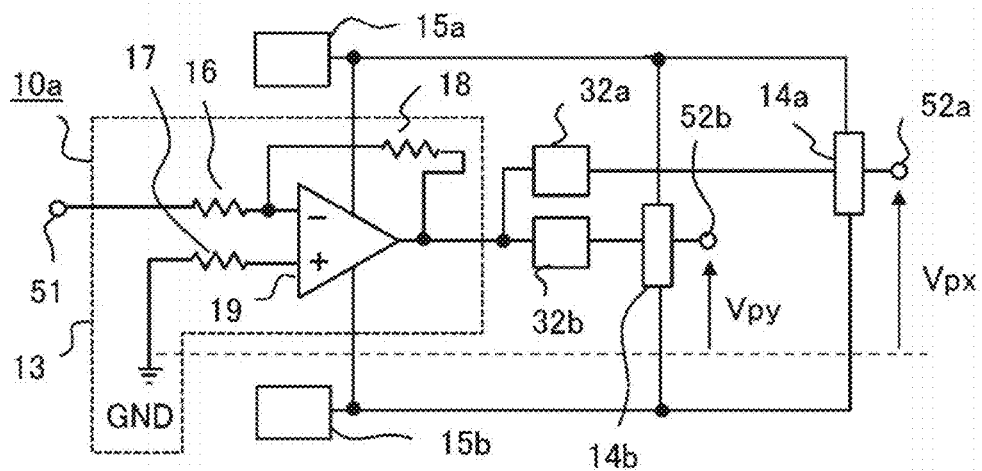
FIG. 36 is a diagram showing a fifth example of the first injection waveform generator in FIG. 27.
Figure 37:
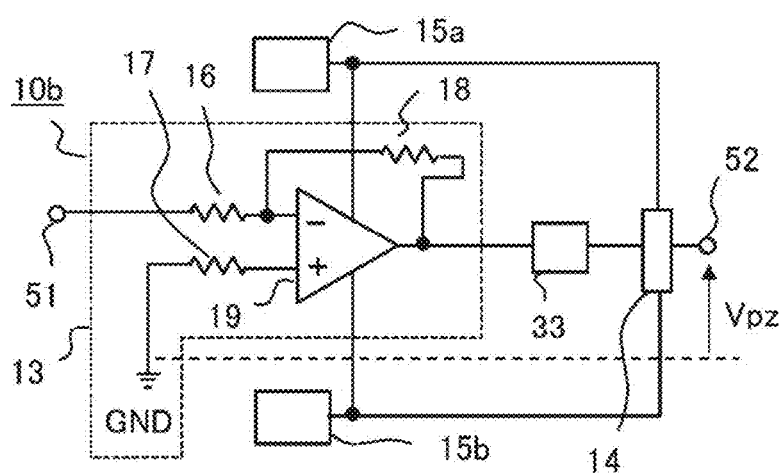
FIG. 37 is a diagram showing a fifth example of the second injection waveform generator in FIG. 27.
Figure 38:
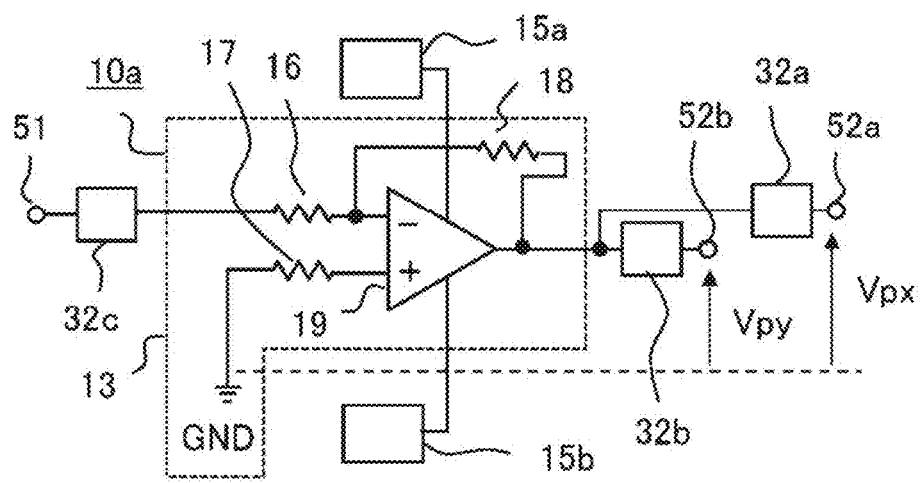
FIG. 38 is a diagram showing a sixth example of the first injection waveform generator in FIG. 27.
Figure 39:
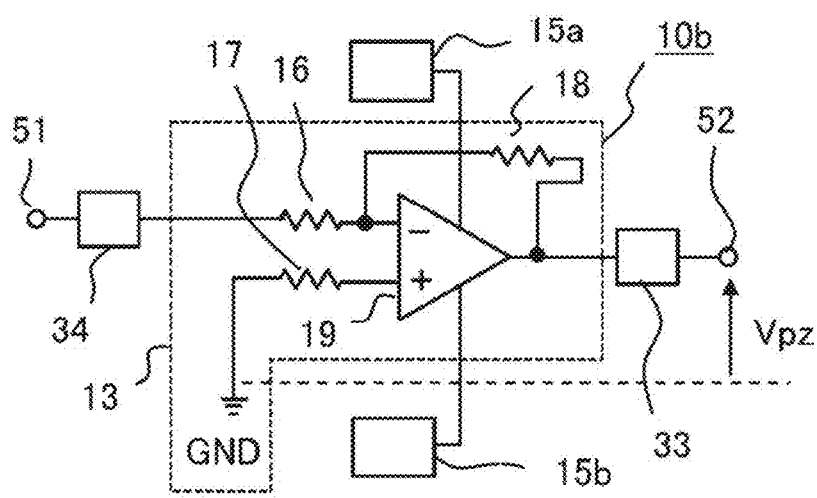
FIG. 39 is a diagram showing a sixth example of the second injection waveform generator in FIG. 27.
Figure 40:
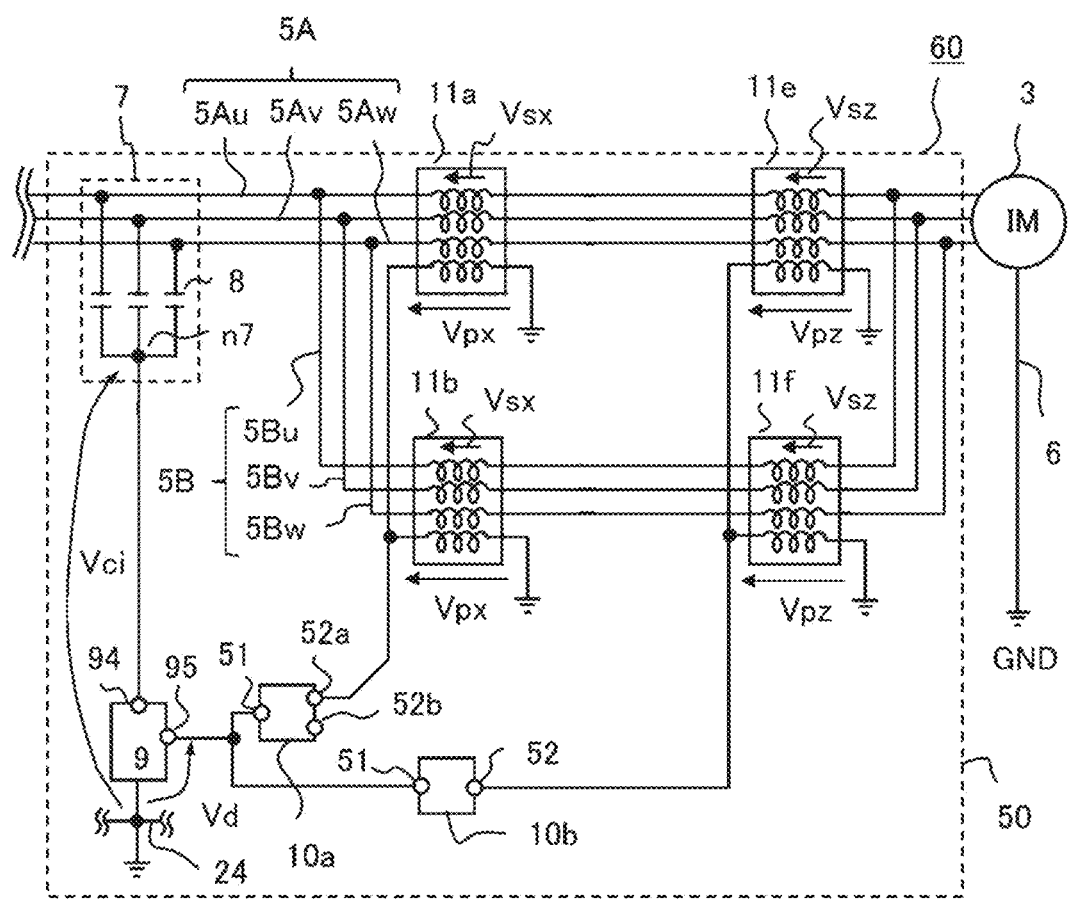
FIG. 40 is a diagram showing a configuration of a second noise filter and an electric motor drive system according to Embodiment 3.

FIG. 27 is a diagram showing a configuration of a first noise filter and an electric motor drive system according to Embodiment 3. FIG. 28 is a diagram showing a first example of a first injection waveform generator in FIG. 27, and FIG. 29 is a diagram showing a first example of a second injection waveform generator in FIG. 27. FIG. 30 is a diagram showing a second example of the first injection waveform generator in FIG. 27, and FIG. 31 is a diagram showing a second example of the second injection waveform generator in FIG. 27. FIG. 32 is a diagram showing a third example of the first injection waveform generator in FIG. 27, and FIG. 33 is a diagram showing a third example of the second injection waveform generator in FIG. 27. FIG. 34 is a diagram showing a fourth example of the first injection waveform generator in FIG. 27, and FIG. 35 is a diagram showing a fourth example of the second injection waveform generator in FIG. 27. FIG. 36 is a diagram showing a fifth example of the first injection waveform generator in FIG. 27, and FIG. 37 is a diagram showing a fifth example of the second injection waveform generator in FIG. 27. FIG. 38 is a diagram showing a sixth example of the first injection waveform generator in FIG. 27, and FIG. 39 is a diagram showing a sixth example of the second injection waveform generator in FIG. 27. FIG. 40 is a diagram showing a configuration of a second noise filter and an electric motor drive system according to Embodiment 3.

A noise filter 50 of Embodiment 3 shown in FIG. 27 differs from the noise filter 50 of Embodiment 1 in that common-mode transformers 11a, 11c, 11 e are connected to the three-phase power line 5A, common-mode transformers 11b, 11d, 11f are connected to the three-phase power line 5B, and two injection waveform generators 10a, 10b are provided. The first example of the first injection waveform generator 10a shown in FIG. 28 differs from the injection waveform generator 10 shown in FIG. 5 in that the band limiter 12 is changed to a band limiter 32 that reduces high-frequency band components while causing low-frequency band components to pass therethrough, and two output terminals 52a, 52b are included. The first example of the second injection waveform generator 10b shown in FIG. 29 differs from the injection waveform generator 10 shown in FIG. 5 in that the band limiter 12 is changed to a band limiter 33 that reduces low-frequency band components while causing high-frequency band components to pass therethrough. The injection waveform generator 10a outputs an output voltage Vpx as a first output voltage from the output terminal 52a, and outputs an output voltage Vpy as another first output voltage from the output terminal 52b. The injection waveform generator 10b outputs an output voltage Vpz as a second output voltage from the output terminal 52. In Embodiment 3, the first output voltage and the other first output voltage are output voltages outputted from the injection waveform generator 10a as the first injection waveform generator, and the second output voltage is an output voltage outputted from the injection waveform generator 10b as the second injection waveform generator. Note that the second output voltage in Embodiment 2 corresponds to the other first output voltage in Embodiment 3. Further note that, in FIG. 28 and FIG. 29, the wiring 24 placed at the ground potential is omitted from illustration. Also, in FIG. 30 to FIG. 39, the wiring 24 placed at the ground potential is omitted from illustration. Meanwhile, it can also be said that the noise filter 50 of Embodiment 3 is provided with an injection waveform generator including two waveform generators (injection waveform generators 10a, 10b).

Description will be made mainly on differences from the noise filter 50 of Embodiment 1. The injection waveform generator 10a is designed to amplify only low-frequency band components and to reduce high-frequency band components. In contrast, the injection waveform generator 10b is designed to amplify only high-frequency band components and to reduce low-frequency band components. Namely, the injection waveform generator 10a outputs the output voltage Vpx in a low-frequency band to the common-mode transformers 11a, 11b, and outputs the output voltage Vpy in the low-frequency band to the common-mode transformers 11c, 11d. The injection waveform generator 10b outputs the output voltage Vpz in a high-frequency band to the common-mode transformers 11e, 11f. The output voltages Vpx, Vpy differ from the output voltage Vpz in frequency band. Accordingly, low-frequency band voltages are applied to the common-mode transformers 11a, 11b, 11c, 11d connected to the injection waveform generator 10a, while a high-frequency band voltage is applied to the common-mode transformers 11e, 11f connected to the injection waveform generator 10b. Further, the output voltages Vpx, Vpy may differ from the output voltage Vpz in voltage value, in accordance with their frequency bands.

In Embodiment 3, like in Embodiment 2, equal numbers of common-mode transformers having the same configurations are connected to the respective three-phase power lines 5A, 5B. Namely, the common-mode transformers are connected to the three-phase power lines 5A, 5B so that the total injection voltage Vsa superimposed on the three-phase power line 5A and the total injection voltage Vsb superimposed on the three-phase power line 5B are equal to each other. In FIG. 27, such an example is shown in which the common-mode transformer 11a and the common-mode transformer 11b to which the output voltage Vpx is inputted have the same configurations, the common-mode transformer 11c and the common-mode transformer 11d to which the output voltage Vpy is inputted have the same configurations, and the common-mode transformer 11e and the common-mode transformer 11f to which the output voltage Vpz is inputted have the same configurations. Note that the common-mode transformers 11a, 11c, 11e connected to the three-phase power line 5A may have either the same or different configurations. The common-mode transformer connected to the three-phase power line 5A (mainline-system transformer) and the common-mode transformer connected to the three-phase power line 5B (branch-line-system transformer), to which the same output voltage is inputted, have the same configurations.

The multiple common-mode transformers 11a to 11f in the noise filter 50 of Embodiment 3 are composed of equal numbers of common-mode transformers which are connected to the respective three-phase power lines of multiline systems and whose configurations for each of the applied output voltages Vpx, Vpy, Vpz are the same. In the example of FIG. 27, the output voltages Vpx, Vpy are outputted from the injection waveform generator 10a and the output voltage Vpz is outputted from the injection waveform generator 10b. In this regard, let us assume the common-mode transformers 11b, 11d, 11f connected to three-phase power line 5B in the case, for example, where the common-mode transformers 11a, 11c, 11 e connected to the three-phase power line 5A are designed to have mutually different configurations, the output voltages Vpx, Vpy are applied to the common-mode transformers 11a, 11c from the first injection waveform generator 10a and the output voltage Vpz is applied to the common-mode transformer 11e from the second injection waveform generator 10b. In this case, the configurations of the common-mode transformers 11b, 11d, 11f connected to the three-phase power line 5B are the same as those of the common-mode transformers 11a, 11c, 11 e connected to the three-phase power line 5A, respectively, and the output voltages Vpx, Vpy are applied to the common-mode transformers 11b, 11d from the injection waveform generator 10a and the output voltage Vpz is applied to the common-mode transformer 11f from the injection waveform generator 10b.

According to the noise filter 50 of Embodiment 3, injection voltages Vsx, Vsy, Vsz converted through the common-mode transformers from the output voltages Vpx, Vpy, Vpz outputted by the injection waveform generators 10a, 10b, are superimposed equally on each of the three-phase power lines 5A, 5B configured as multiline systems. Thus, even if one injection waveform generator has failed and becomes unable to apply a voltage to the common-mode transformers connected thereto, since the other injection waveform generator is operating properly, no difference occurs between the total injection voltages Vsa, Vsb for the three-phase power lines 5A, 5B. Accordingly, even if one injection waveform generator has failed, it is possible to suppress the occurrence of the circulation current circulating through the three-phase power lines 5A, 5B.

The second example of the first injection waveform generator 10a shown in FIG. 30 differs from the injection waveform generator 10 shown in FIG. 6 in that the band limiter 12 is changed to the band limiter 32 that reduces high-frequency band components while causing low-frequency band components to pass there-through, and two output terminals 52a, 52b are included. The second example of the second injection waveform generator 10b shown in FIG. 31 differs from the injection waveform generator 10 shown in FIG. 6 in that the band limiter 12 is changed to the band limiter 33 that reduces low-frequency band components while causing high-frequency band components to pass therethrough. The injection waveform generator 10a outputs the output voltage Vpx from the output terminal 52a, and outputs the output voltage Vpy from the output terminal 52b. The injection waveform generator 10b outputs the output voltage Vpz from the output terminal 52. Further, the second example of the first injection waveform generator 10a differs from the first example of the first injection waveform generator 10a in that the current buffer 14 is added between the output terminal of the amplifier 13 and the output terminals 52a, 52b. The second example of the second injection waveform generator 10b differs from the first example of the second injection waveform generator 10b in that the current buffer 14 is added between the output terminal of the amplifier 13 and the output terminal 52. Because of the current buffer 14, the second example of the first injection waveform generator 10a and the second example of the second injection waveform generator 10b can increase the current capacity indicative of a current supply amount, in comparison to the first examples of the injection waveform generator 10a, 10b, respectively.

The third example of the first injection waveform generator 10a shown in FIG. 32 differs from the first example of the first injection waveform generator 10a shown in FIG. 28 in that the band limiter 32 is not placed on the side near the input terminal 51 and instead, band limiters 32a, 32b are disposed between the output terminal of the amplifier 13 and the respective output terminals 52a, 52b. The frequency band of the band limiter 32a and the frequency band of the band limiter 32b may be the same or different. When the frequency band of the band limiter 32a and the frequency band of the band limiter 32b are different, it is possible to output the output voltages Vpx, Vpy in different frequency bands. Note that the frequency bands for the output voltages Vpx, Vpy are each lower than the frequency band for the output voltage Vpz. The third example of the second injection waveform generator 10b shown in FIG. 33 differs from the first example of the second injection waveform generator 10b shown in FIG. 29 in that the band limiter 33 is not placed on the side near the input terminal 51 but the band limiter 33 is disposed between the output terminal of the amplifier 13 and the output terminal 52.

The fourth example of the first injection waveform generator 10a shown in FIG. 34 differs from the third example of the first injection waveform generator 10a in that the current buffer 14 is added between the output terminal of the amplifier 13 and the input sides of the band limiters 32a, 32b. The fourth example of the second injection waveform generator 10b shown in FIG. 35 differs from the third example of the second injection waveform generator 10b in that the current buffer 14 is added between the output terminal of the amplifier 13 and the input side of the band limiter 33. Because of the current buffer 14, the fourth example of the first injection waveform generator 10a and the fourth example of the second injection waveform generator 10b can increase the current capacity indicative of a current supply amount, in comparison to the third examples of the injection waveform generator 10a, 10b, respectively.

Although the fourth example of the first injection waveform generator 10a shown in FIG. 34 is an example in which the current buffer 14 is disposed between the output terminal of the amplifier 13 and the input sides of the band limiters 32a, 32b, the current buffers 14 may instead be disposed between the output sides of the band limiters 32a, 32b and the output terminals 52a, 52b. The fifth example of the first injection waveform generator 10a shown in FIG. 36 differs from the third example of the first injection waveform generator 10a in that the current buffer 14a is added between the output side of the band limiter 32a and the output terminal 52a, and the current buffer 14b is added between the output side of the band limiter 32b and the output terminal 52b. Because of the current buffers 14a, 14b, the fifth example of the first injection waveform generator 10a can increase the current capacity indicative of a current supply amount, in comparison to the third example of the injection waveform generator 10a.

Likewise, although the fourth example of the second injection waveform generator 10b shown in FIG. 35 is an example in which the current buffer 14 is disposed between the output terminal of the amplifier 13 and the input side of the band limiter 33, the current buffer 14 may instead be disposed between the output side of the band limiter 33 and the output terminal 52. The fifth example of the second injection waveform generator 10b shown in FIG. 37 differs from the third example of the second injection waveform generator 10b in that the current buffer 14 is added between the output side of the band limiter 33 and the output terminal 52. Because of the current buffer 14, the fifth example of the second injection waveform generator 10b can increase the current capacity indicative of a current supply amount, in comparison to the third example of the injection waveform generator 10b.

The sixth example of the first injection waveform generator 10a shown in FIG. 38 differs from the third example of the first injection waveform generator 10a in that a band limiter 32c is disposed between the input terminal 51 and the input side of the amplifier 13. The sixth example of the second injection waveform generator 10b shown in FIG. 39 differs from the third example of the second injection waveform generator 10b in that the band limiter 34 is disposed between the input terminal 51 and the input side of the amplifier 13. Like the band limiters 32a, 32b, the frequency band of the band limiter 32c is lower than those of the band limiters 33, 34 in the second injection waveform generator 10b. Like the band limiter 33, the frequency band of the band limiter 34 is higher than those of the band limiters 32a, 32b, 32c in the first injection waveform generator 10a.

Since the sixth example of the first injection waveform generator 10a further includes the band limiter 32c on its input side, the band limiters 32a, 32b on the output side can be downsized. Thus, by using small-size band limiters 32a, 32b, 32c, the sixth example of the first injection waveform generator 10a can reduce the band-limiter total power consumption in comparison to the third example of the first injection waveform generator 10a including two band limiters 32a, 32b. Since the sixth example of the second injection waveform generator 10b further includes the band limiter 34 on its input side, the band limiters 33 on the output side can be downsized. Thus, by using small-size band limiters 33, 34, the sixth example of the second injection waveform generator 10b can reduce the band-limiter total power consumption in comparison to the third example of the second injection waveform generator 10b including one band limiter 33.

Also in the first to sixth examples of the first injection waveform generator 10a, like in the seventh example of the injection waveform generator 10 of Embodiment 1 shown in FIG. 22, individual amplifiers 13a, 13b may be provided for the output terminals 52a, 52b, respectively. When this is the case, the first example of the first injection waveform generator 10a may result from the injection waveform generator 10 in FIG. 22 by changing the band limiter 12 to the band limiter 32. When the second example of the first injection waveform generator 10a is assumed, the current buffer 14 is disposed between the amplifier 13a and the output terminal 52a and another current buffer 14 is disposed between the amplifier 13b and the output terminal 52b. When the third and sixth examples of the first injection waveform generator 10a are assumed, the band limiter 12a is disposed between the amplifier 13a and the output terminal 52a, and the band limiter 12b is disposed between the amplifier 13b and the output terminal 52b. When the fourth example of the first injection waveform generator 10a is assumed, the current buffer 14 and the band limiter 12a are disposed between the amplifier 13a and the output terminal 52a, and another current buffer 14 and the band limiter 12b are disposed between the amplifier 13b and the output terminal 52b. When the fifth example of the first injection waveform generator 10a is assumed, the band limiter 12a and the current buffer 14a are disposed between the amplifier 13a and the output terminal 52a, and the band limiter 12b and the current buffer 14b are disposed between the amplifier 13b and the output terminal 52b. In these cases, the first to sixth examples of the first injection waveform generator 10a each can output the output voltage Vpx and the output voltage Vpy having different voltage values.

In FIG. 27, such a case is shown where there are two injection waveform generators, and three common-mode transformers are connected to each one of the tree-phase power lines 5A, 5B; however, the number of common-mode transformers is not limited thereby. For example, as shown in FIG. 40, it is allowed that two common-mode transformers 11a, 11e are connected to the three-phase power line 5A; two common-mode transformers 11b, 11f are connected to the three-phase power line 5B; and output voltages Vpx, Vpz are outputted from two injection waveform generators 10a, 10b, respectively. The second noise filter 50 of Embodiment 3 shown in FIG. 40 differs from the noise filter 50 of Embodiment 2 shown in FIG. 15 in that the output voltages Vpx, Vpz are outputted from two injection waveform generators 10a, 10b to the common-mode transformers 11a, 11e connected to the three-phase power line 5A and the common-mode transformers 11b, 11f connected to the three-phase power line 5B, respectively. Note that, although the injection waveform generator 10a is exemplified as having two output terminals 52a, 52b, since the output terminal 52b is not used, it may instead be another injection waveform generator 10a without having the output terminal 52b. When this is the case, components to be connected only to the output terminal 52b are eliminated.

Further, such a case has been shown where the injection waveform generators 10a, 10b are mutually different in frequency band, namely, have different frequency characteristics; however, they may be configured to have the same gains and frequency characteristics. When this is the case, the noise filter 50 of Embodiment 3 produces a function that is the same as that by the noise filter 50 of Embodiment 2 in the case where the output voltages in the same frequency band are outputted from the plural output terminals, and thus achieves an effect similar to that by the noise filter 50 of Embodiment 2. Note that the injection waveform generators 10a, 10b may include their respective amplifiers 13 having different gains, to thereby output the output voltages Vpx, Vpz having different voltage values.

So far, such cases have been described where the output voltages Vpx, Vpy, Vpz are different from each other. When the output voltages Vpx, Vpy, Vpz are different from each other, the common-mode transformers 11a, 11 b, 11c are different from each other in at least one of core material, core outer diameter, core inner diameter, core cross-section area and turn ratio. Namely, the common-mode transformers 11a, 11b, 11c have not the same configurations but the different configurations. However, as described previously, the common-mode transformers 11a, 11 b, 11c may have the same configurations.

It is noted that the noise filters 50 of Embodiments 1 to 3 are exemplified as being employed in the electric motor drive system 60 in which the power converter 2 that converts three-phase AC power through DC power to other three-phase AC power is installed; however, they are not limited thereby. The noise filters 50 of Embodiments 1 to 3 may also be employed in any system in which a power converter that produces a common-mode voltage due to switching operations of semiconductor elements is installed. For example, the power converter 2 may be an insulated DC-DC converter. In this case, the AC power supply 1 is substituted with a DC power supply, and the induction motor 3 is substituted with a DC motor.

As described above, according to the noise filter 50 of Embodiment 3, the common-mode transformers 11b, 11d, 11f, the respective numbers and configurations of which are respectively the same as those of the common-mode transformers 11a, 11c, 11 e connected to the three-phase power line 5A, are connected to the three-phase power line 5B. This allows, like in Embodiment 1, to employ small-diameter electric cables for the secondary windings of the common-mode transformers. Accordingly, the core to be used can be downsized and thus, it is possible to configure the noise filter with small-size common-mode transformers, even when the output current of the power converter 2 is large. Further, the noise filter 50 of Embodiment 3 includes plural injection waveform generators 10a, 10b each outputting a same voltage to the common-mode transformers having the same configurations and connected to the respective three-phase power lines 5A, 5B. Thus, even if one injection waveform generator has failed and becomes unable to output the output voltage, since the other injection waveform generator is operating properly, no voltage difference occurs between the total injection voltages Vsa, Vsb for the three-phase power lines 5A, 5B. Accordingly, it is possible to suppress the occurrence of the circulation current circulating through the three-phase power lines 5A, 5B.

It is noted that the noise filters 50 of Embodiments 1 to 3 are exemplified by the case where equal numbers of common-mode transformers having the same configurations are connected to the respective three-phase power lines 5A, 5B, so that the same superimposing voltages are superimposed on the three-phase power lines 5A, 5B; however, they are not limited thereby. For example, different numbers of common-mode transformers may be connected to the three-phase power line 5A and the three-phase power line 5B. When this is the case, it suffices that the superimposing voltage superimposed on the three-phase power line 5A (total injection voltage Vsa) and the superimposing voltage superimposed on the three-phase power line 5B (total injection voltage Vsb) both satisfy the formula (13), in such a manner that output voltages Va, Vb outputted from different injection waveform generators 10a, 10b or the injection waveform generator 10 provided with different amplifiers 13a, 13b, are outputted to the common-mode transformers connected to the three-phase power line 5A and the common-mode transformers connected to the three-phase power line 5B, respectively. Namely, it suffices that the superimposing voltage on the three-phase power line 5A satisfies |Vci-Vsa|≤Vto, and the superimposing voltage on the three-phase power line 5B satisfies |Vci-Vsb|≤Vto. Note that a superimposing voltage induced by one common-mode transformer can also be said to be a total injection voltage Vst comprised of a single injection voltage Vs.

It is further noted that, in this application, a variety of exemplary embodiments and examples are described; however, every characteristic, configuration or function that is described in one or more embodiments, is not limited to being applied to a specific embodiment, and may be applied singularly or in any of various combinations thereof to another embodiment. Accordingly, an infinite number of modified examples that are not exemplified here are supposed within the technical scope disclosed in the present description. For example, such cases shall be included where at least one configuration element is modified; where at least one configuration element is added or omitted; and furthermore, where at least one configuration element is extracted and combined with a configuration element of another embodiment.

DESCRIPTION OF REFERENCE NUMERALS AND SIGNS

2: power converter, 4: three-phase power line, 4A, 4B: three-phase power line (three-phase power line of each line system), 5: three-phase power line, 5A, 5B, 5C: three-phase power line (three-phase power line of each line system), 7: voltage detector, 9: voltage divider circuit, 10: injection waveform generator, 10a, 10b: injection waveform generator (waveform generator), 11a, 11b, 11c, 11d, 11e, 11f: common-mode transformer, 12, 12a, 12b, 12c: band limiter, 13: amplifier, 32, 32a, 32b, 32c: band limiter, 33: band limiter, 34: band limiter, 50: noise filter, 52, 52a, 52b, 52c: output terminal, Gi: gain, I: inner diameter, L: outer diameter, Nt: connected number of transformers, Q1, Q2, Q3, Q4, Q5, Q6: semiconductor element, Rr: turn ratio, Vci: common-mode voltage, Vd: divided voltage, Vp, Vpx, Vpy, Vpz: output voltage, Vs, Vsx, Vsy, Vsz: injection voltage (superimposing voltage), Vst, Vsa, Vsb: total injection voltage (superimposing voltage), Vto: allowable value.

The invention claimed is:

1. A noise filter which reduces a common-mode voltage produced by a power converter that performs power conversion using switching operations of semiconductor elements, said noise filter comprising:
    a voltage detector that detects the common-mode voltage produced by the power converter;
    a voltage divider circuit that outputs a divided voltage divided from the common-mode voltage detected by the voltage detector;
    multiple common-mode transformers that are connected separately to respective power lines of multiline systems connected in parallel relation to each other to an input or output of the power converter, and that superimpose a superimposing voltage having an opposite polarity to the common-mode voltage on each of the power lines of multiline systems; and
    an injection waveform generator that generates at least one output voltage to be outputted to primary sides of the multiple common-mode transformers, on a basis of the divided voltage;
    wherein the injection waveform generator generates as the output voltage, a voltage with which a difference between the superimposing voltage to be superimposed on each of the power lines and the common-mode voltage is within an allowable value.

2. The noise filter of claim 1, wherein the common-mode transformers are connected one by one to each of the power lines of multiline systems; and
    wherein the superimposing voltage is an injection voltage that is outputted by each of the common-mode transformers at its secondary side.

3. The noise filter of claim 1, wherein the common-mode transformers are composed of equal numbers of plural common-mode transformers that are connected to the respective power lines of multiline systems; and
    wherein the superimposing voltage is a total injection voltage resulting from summation of injection voltages that are outputted by the plural common-mode transformers connected to each one of the power lines, at their secondary sides.

4. The noise filter of claim 2, wherein the injection waveform generator outputs as the output voltage, a same voltage to all of the primary sides of the multiple common-mode transformers.

5. The noise filter of claim 3, wherein the plural common-mode transformers connected to one of the power lines of multiline systems, is comprised of a first common-mode transformer and a second common-mode transformer; and
    wherein the first common-mode transformer and the second common-mode transformer are different from each other in at least one of core material, core cross-section area, core outer diameter, core inner diameter and turn ratio.

6. The noise filter of claim 3, wherein the plural common-mode transformers connected to each one of the power lines of multiline systems, are comprised of a first common-mode transformer and a second common-mode transformer; and wherein the first common-mode transformer and the second common-mode transformer are different from each other in at least one of core material, core cross-section area, core outer diameter, core inner diameter and turn ratio.

7. The noise filter of claim 6, wherein the injection waveform generator has a first output terminal and a second output terminal, to thereby output from the first output terminal to the primary sides of the first common-mode transformers connected to the respective power lines of multiline systems, a first output voltage as the output voltage that is common to the first common-mode transformers; and to thereby output from the second output terminal to the primary sides of the second common-mode transformers connected to the respective power lines of multiline systems, a second output voltage as the output voltage that is common to the second common-mode transformers and is different from the first output voltage.

8. The noise filter of claim 6, wherein the injection waveform generator has a first waveform generator and a second waveform generator, to thereby output from the first waveform generator to the primary sides of the first common-mode transformers connected to the respective power lines of multiline systems, a first output voltage as the output voltage that is common to the first common-mode transformers; and to thereby output from the second waveform generator to the primary sides of the second common-mode transformers connected to the respective power lines of multiline systems, a second output voltage as the output voltage that is common to the second common-mode transformers and is different from the first output voltage.

9. The noise filter of claim 2, wherein the common-mode transformers are equal in core material, core cross-section area, core outer diameter, core inner diameter and turn ratio.

10. The noise filter of claim 3, wherein the injection waveform generator has a plurality of output terminals, to thereby output from the output terminals, different voltages as the output voltage, each to the primary side of each corresponding one of the common-mode transformers.

11. The noise filter of claim 3, wherein the injection waveform generator has a plurality of waveform generators; and wherein the waveform generators output different voltages as the output voltage, each to the primary side of each corresponding one of the common-mode transformers.

12. The noise filter of claim 10, wherein the different voltages outputted by the injection waveform generator are different in voltage value.

13. The noise filter of claim 7, wherein the first output voltage and the second output voltage are different in voltage value.

14. The noise filter of claim 10, wherein the injection waveform generator includes a band limiter that changes a frequency band of the divided voltage; and wherein the different voltages outputted by the injection waveform generator are different in frequency band.

15. The noise filter of claim 7, wherein the injection waveform generator includes a band limiter that changes a frequency band of the divided voltage; and wherein the first output voltage and the second output voltage are different in frequency band.

16. The noise filter of claim 3, wherein the injection waveform generator includes an amplifier that amplifies the divided voltage, and wherein a gain of the amplifier is set on a basis of a number of the common-mode transformers and turn ratios thereof.

17. The noise filter of claim 3, wherein the injection waveform generator outputs as the output voltage, a same voltage to all of the primary sides of the multiple common-mode transformers.

18. The noise filter of claim 6, wherein the injection waveform generator has a plurality of output terminals, to thereby output from the output terminals, different voltages as the output voltage, each to the primary side of each corresponding one of the common-mode transformers.

19. The noise filter of claim 6, wherein the injection waveform generator has a plurality of waveform generators; and wherein the waveform generators output different voltages as the output voltage, each to the primary side of each corresponding one of the common-mode transformers.

20. The noise filter of claim 11, wherein the different voltages outputted by the injection waveform generator are different in voltage value.

* * * * *